(12) United States Patent
Mizuno et al.

(10) Patent No.: US 7,816,430 B2
(45) Date of Patent: *Oct. 19, 2010

(54) COMPOSITION OF POLYCYANATE ESTER AND BIPHENYL EPOXY RESIN

(75) Inventors: Yasuyuki Mizuno, Ibaraki (JP); Daisuke Fujimoto, Ibaraki (JP); Hiroshi Shimizu, Ibaraki (JP); Kazuhito Kobayashi, Ibaraki (JP); Takayuki Sueyoshi, Kagoshima (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 998 days.

This patent is subject to a terminal disclaimer.

(21) Appl. No.: 10/529,738

(22) PCT Filed: Sep. 29, 2003

(86) PCT No.: PCT/JP03/12399

§ 371 (c)(1),
(2), (4) Date: Mar. 30, 2005

(87) PCT Pub. No.: WO2004/029127

PCT Pub. Date: Apr. 8, 2004

(65) Prior Publication Data

US 2006/0167189 A1    Jul. 27, 2006

(30) Foreign Application Priority Data

Sep. 30, 2002  (JP) .............................. 2002-286878
Sep. 30, 2002  (JP) .............................. 2002-287071

(51) Int. Cl.
*C08K 5/01*    (2006.01)
*C08K 5/07*    (2006.01)
*C08L 63/00*   (2006.01)
*C08L 101/02*  (2006.01)

(52) U.S. Cl. ................. 523/456; 523/400; 523/453; 523/454; 523/455; 523/462; 525/396

(58) Field of Classification Search ................. None
See application file for complete search history.

(56) References Cited

U.S. PATENT DOCUMENTS

| | | | | |
|---|---|---|---|---|
| 4,477,629 A | | 10/1984 | Hefner, Jr. | |
| 4,496,695 A | * | 1/1985 | Sugio et al. ............. | 525/391 |
| 6,156,831 A | * | 12/2000 | Sase et al. ............... | 524/101 |
| 7,022,777 B2 | * | 4/2006 | Davis et al. ............. | 525/396 |
| 7,157,506 B2 | * | 1/2007 | Mizuno et al. ........... | 523/209 |
| 2005/0121229 A1 | * | 6/2005 | Takai et al. ............. | 174/261 |

FOREIGN PATENT DOCUMENTS

| | | | |
|---|---|---|---|
| EP | 0 797 378 | | 9/1997 |
| EP | 0 889 096 | | 1/1999 |
| EP | 1 076 262 | | 2/2001 |
| JP | 9-100349 | | 4/1997 |
| JP | 2000-191776 A | * | 6/2000 |
| JP | 2000-191776 | | 7/2000 |
| JP | 2000-319509 | | 11/2000 |
| JP | 2000-336188 A | * | 12/2000 |
| JP | 2001-172473 | | 6/2001 |
| JP | 2001-240723 | | 9/2001 |
| JP | 2001-240723 A | * | 9/2001 |
| JP | 2002-194121 | | 7/2002 |
| JP | 2002-309085 | | 10/2002 |
| JP | 2002-309085 A | * | 10/2002 |
| WO | WO 97/01595 | | 1/1997 |
| WO | WO 01/70885 A1 | * | 9/2001 |

OTHER PUBLICATIONS

Derwent accession No. 2002-097284 for WO 01/70885 and U.S. 7,157,506, Fujimoto et al., Sep. 27, 2001, four pages.*

* cited by examiner

*Primary Examiner*—Robert Sellers
(74) *Attorney, Agent, or Firm*—Antonelli, Terry, Stout & Kraus, LLP.

(57) ABSTRACT

The present invention provides a resin composition for printed wiring board to be used for electronic devices in which operating frequency exceeds 1 GHz, and a varnish, a prepreg and a metal clad laminated board using the same. One invention of the present invention is a resin composition for printed wiring board containing a cyanate ester compound having 2 or more cyanate groups in the molecule and/or a prepolymer thereof, an epoxy resin containing at least one kind of an epoxy resin having a biphenyl structure in the molecule, and a varnish, a prepreg and a metal clad laminated board using the same.

29 Claims, No Drawings

COMPOSITION OF POLYCYANATE ESTER AND BIPHENYL EPOXY RESIN

TECHNICAL FIELD

The present invention relates to a resin composition for printed wiring board, and a varnish, a prepreg and a metal clad laminated board using the same. More specifically, it relates to a resin composition for printed wiring board which is used for electronic devices in which operating frequency exceeds 1 GHz, and a varnish, a prepreg and a metal clad laminated board using the same.

BACKGROUND ART

In recent years, in mobile communication devices represented by cellular phone or in net-work related electronic devices such as server, router, etc., it is required to transmit and treat huge amount of information with low loss and high speed, so that electric signals treated on the printed wiring board also become high frequencies. However, when a frequency is higher, electric signals likely decreased, so that it is required to use a material having low transmission loss for a printed wiring board to be used in these fields of art. That is, in a high frequency band region of 1 GHz or higher, a material having excellent dielectric characteristics represented by low values in dielectric constant and dielectric dissipation factor is required to be used.

In these backgrounds, it has been attracted attention to use a cyanate ester resin having excellent dielectric characteristics of a cured product in a resin composition for printed wiring board. Heretofore, it has been proposed a resin composition in which a generally used epoxy resin such as a bisphenol A type epoxy resin, a brominated bisphenol A type epoxy resin, a phenol novolac type epoxy resin and a cresol novolac type epoxy resin is formulated with a cyanate ester resin, and it has been known that humidity resistance or heat resistance under humidity are improved than the case of a cyanate ester resin alone (for example, Japanese Patent Publication No. Sho. 46-41112, Japanese Unexamined Patent Publications No. Sho. 50-132099 and No. Sho. 57-143320). However, these resin compositions are inferior in dielectric characteristics than those in which no epoxy resin is formulated due to the effect of an epoxy resin.

Moreover, according to the present inventors, a resin composition in which dielectric characteristics at high frequency band region is improved has been proposed as compared to the case where the above-mentioned generally used epoxy resin is utilized by selecting, as an epoxy resin, a specific epoxy resin such as a naphthalene skeleton-containing epoxy resin, an aralkylene skeleton-containing epoxy resin, a lower alkyl group substituted phenol salicylic aldehyde novolac type epoxy resin, and a dicyclopentadiene skeleton-containing epoxy resin, and formulating them with a cyanate ester resin (for example, Japanese Unexamined Patent Publications No. Hei. 8-176273, No. Hei. 8-176274 and No. Hei. 11-60692).

Also, a resin composition having sufficient dielectric characteristics even when an epoxy resin is formulated has been proposed by the present inventors by modifying a cyanate ester resin with a specific monovalent phenol compound to prepare a phenol-modified cyanate ester resin composition, whereby dielectric characteristics possessed by a cyanate ester resin have been more improved (for example, Japanese Unexamined Patent Publication No. 2001-240723).

However, in either of the above-mentioned resin compositions, humidity resistance or heat resistance of a cured product is improved than the case where a cyanate ester resin or a modified cyanate ester resin is used alone, but due to the effect of an epoxy resin, a dielectric constant and a dielectric dissipation factor at high frequency band region are increased, or stability of dielectric characteristics relative to temperature is observed to be lowered (for example, increase in drift accompanied by temperature change of dielectric characteristics), so that the problems remain in the point of improving dielectric characteristics.

In particular, in a multi-layered printed wiring board to be used for wireless base station equipment use or high speed server, router, etc., temperature of the printed wiring board during operation of the device sometimes becomes a high temperature of 85 to 90° C., whereby there are possibility of causing significant problems that a dielectric constant is fluctuated due to change in temperature, or mismatching in impedance or transmission error accompanied by increase in transmission loss occurs when a dielectric dissipation factor becomes high. Accordingly, necessity for a resin composition for printed wiring board excellent in dielectric characteristics including temperature-dependency has been increased.

Also, in such background, as a resin composition for printed wiring board, a resin composition in which a cyanate ester excellent in dielectric characteristics and a polyphenylene ether are mixed and kneaded has been proposed (for example, Japanese Patent Publication Sho. No. 61-18937). However, in these resin compositions, when a formulation amount of the cyanate ester is larger, a dielectric dissipation factor tends to be high relative to the value of the dielectric constant. On the other hand, when a formulation amount of the polyphenylene ether is increased to lower the dielectric dissipation factor, a melting viscosity of the resin composition becomes high whereby flowability thereof becomes insufficient, so that there are problems that molding property is worsened.

Also, a resin composition in which an epoxy resin such as a bisphenol A type epoxy resin, a brominated bisphenol A type epoxy resin, a phenol novolac type epoxy resin and a cresol novolac type epoxy resin is formulated to a cyanate ester resin and a polyphenylene ether has been proposed (for example, see Japanese Patent Publication No. Hei. 4-57696). However, in these resin compositions, there are problems that dielectric characteristics at high frequency band region do not yet satisfy with a required level due to the effects of components other than the cyanate ester resin and the polyphenylene ether. In particular, in a multi-layered printed wiring board to be used for wireless base station equipment use or high speed server, router, etc., temperature of the printed wiring board during operation of the device sometimes becomes a high temperature of 85 to 90° C., whereby there are possibility of causing significant problems that a dielectric constant is fluctuated due to change in temperature, or mismatching in impedance or transmission error accompanied by increase in transmission loss occurs when a dielectric dissipation factor becomes high. Accordingly, necessity for a resin composition for printed wiring board excellent in dielectric characteristics including temperature-dependency has been increased.

Also, a resin composition excellent in heat resistance, molding property and workability as well as having good dielectric characteristics at high frequency band region has been proposed by the present inventors by modifying a cyanate ester resin with a specific monovalent phenol compound to prepare a phenol-modified cyanate ester resin composition, whereby dielectric characteristics possessed by a cyanate ester resin have been more improved, and further a polyphenylene ether resin is formulated (for example, Japanese Unexamined Patent Publications No. Hei. 11-21452 and No.

Hei. 11-21453). However, in these resin compositions, it has been required to further improve humidity resistance under sever conditions such as a pressure cooker test for a long period of time, etc. while maintaining good dielectric characteristics including temperature-dependency.

The present invention has been accomplished in view of the above circumstances, and an object thereof is to provide a resin composition for printed wiring board which has the same molding property and workability as those of a thermosetting resin material such as an epoxy resin, etc., and having excellent humidity resistance and heat resistance, and also shows particularly excellent dielectric characteristics at high frequency band and excellent stability of dielectric characteristics against change in temperature, and a varnish, a prepreg and a metal clad laminated board using the same.

In the first invention of the present invention, the present inventors have earnestly studied and as a result, they have found that a resin composition for printed wiring board which is improved in humidity resistance and has excellent dielectric characteristics at high frequency band, is a little in drift property against temperature change in dielectric characteristics, and shows an excellent stability, by using an epoxy resin having a biphenyl structure (hereinafter referred to as an epoxy resin containing a biphenyl structure (Component (B))) in the molecule as at least one kind of an epoxy resin when an epoxy resin is formulated to a cyanate ester resin (Component (A)), to accomplish the present invention.

In the first invention of the present invention, in a cyanate ester resin composition into which the conventionally employed epoxy resin is formulated, an isocyanuric ring, an oxazolidinone ring, etc. which have higher porality than a triazine ring are formed other than the triazine ring, so that it can be considered that dielectric characteristics (in particular, dielectric dissipation factor) are worsened. On the other hand, in the resin composition containing an epoxy resin containing a biphenyl structure of the present invention, a biphenyl group show hydrophobic property and low polarity, so that it can be considered that bad effects caused by using an epoxy resin in combination on dielectric characteristics are reduced than the conventional one. Also, a biphenyl skeleton with a brittle structure is introduced into the cured product, so that it can be considered that a temperature-dependency of dielectric characteristics is a little due to low mobility of a molecular chain particularly at a high temperature region.

Moreover, the resin composition for printed wiring board of the first invention of the present invention is excellent in heat resistance at the time of absorbing moisture and higher strength and elongation at a glass state region or elongation at a high temperature region as compared with the case where a cyanate ester resin, etc. is used alone or the case where the conventional epoxy resin is used in combination with a cyanate ester resin, so that it is preferred for the uses such as a laminated board to be used for a multilayered printed wiring board of ten-layers or more to which crack resistance at the time of drilling processing or reflow, and severe heat resistance and for a prepreg.

In the second invention of the present invention, the present inventors have carried our earnest studies, and as a result, they have found that a resin composition for printed wiring board which can ensure excellent humidity resistance, has excellent dielectric characteristics at high frequency band, is a little in drift property against temperature change in dielectric characteristics, and shows an excellent stability, by using an epoxy resin having a biphenyl structure (hereinafter referred to as an epoxy resin containing a biphenyl structure (Component (d))) in the molecule as at least one kind of an epoxy resin when an epoxy resin is formulated to a resin composition containing a cyanate ester resin (Component (A)), a monovalent phenol compound (Component (b)) and a polyphenylene ether resin (Component (c)), to accomplish the present invention.

According to the second invention of the present invention, in a cyanate ester resin composition into which the conventionally employed epoxy resin is formulated, an isocyanuric ring, an oxazolidinone ring, etc. which have higher porality than a triazine ring are formed other than the triazine ring, so that it can be considered that dielectric characteristics (in particular, dielectric dissipation factor) are worsened. On the other hand, in the resin composition containing an epoxy resin containing a biphenyl structure of the present invention, a biphenyl group show hydrophobic property and low polarity, so that it can be considered that bad effects caused by using an epoxy resin in combination on dielectric characteristics are reduced than the conventional one. Also, a biphenyl skeleton with a brittle structure is introduced into the cured product, so that it can be considered that a temperature-dependency of dielectric characteristics is a little due to low mobility of a molecular chain particularly at a high temperature region. In addition, biphenyl skeleton-introduced system shows high strength and elongation at the glass state region and high elongation at a high temperature region as compared with the system in which the conventional epoxy resin is used in combination, so that a resin cured product excellent in crack resistance and extremely high heat resistance can be obtained.

Also, the resin compositions for printed wiring board according to the first invention and the second invention of the present invention are excellent in heat resistance under humid conditions and have high strength and elongation at a glass state region or elongation at high temperature region as compared with the case where a cyanate ester resin, etc. has used alone, or the case where a conventional epoxy resin is used in combination with the cyanate ester resin, etc., so that it is preferably used for a multi-layered printed wiring board of 10-layers or more, which is required to have crack resistance at drilling or reflow or to have severe heat resistance, to be used for laminated boards and prepreg use.

DISCLOSURE OF THE INVENTION

The resin composition for printed wiring board of the present invention relates to a composition comprising a cyanate ester compound having 2 or more cyanate groups in the molecule and/or a prepolymer thereof, and an epoxy resin containing at least one kind of an epoxy resin having a biphenyl structure in the molecule.

The resin composition for printed wiring board of the present invention relates to a composition comprising a cyanate ester compound having 2 or more cyanate groups in the molecule and/or a prepolymer thereof, an epoxy resin containing at least one kind of an epoxy resin having a biphenyl structure in the molecule, and a monovalent phenol compound.

The resin composition for printed wiring board of the present invention relates to a composition comprising a phenol-modified cyanate ester oligomer obtainable by reacting a cyanate ester compound having 2 or more cyanate groups in the molecule and/or a prepolymer thereof, a monovalent phenol compound, and an epoxy resin containing at least one kind of an epoxy resin having a biphenyl structure in the molecule.

The resin composition for printed wiring board of the present invention relates to a composition comprising a phenol-modified cyanate ester oligomer obtainable by reacting a cyanate ester compound having 2 or more cyanate groups in the molecule and/or a prepolymer thereof a monovalent phenol compound, and an epoxy resin containing at least one kind of an epoxy resin having a biphenyl structure in the molecule, and a monovalent phenol compound.

The resin composition for printed wiring board of the present invention relates to a composition comprising an epoxy/phenol-modified cyanate ester oligomer obtainable by reacting a cyanate ester compound having 2 or more cyanate groups in the molecule and/or a prepolymer thereof, an epoxy resin containing at least one kind of an epoxy resin having a biphenyl structure in the molecule, and a monovalent phenol compound.

The resin composition for printed wiring board of the present invention relates to a composition comprising an epoxy/phenol-modified cyanate ester oligomer obtainable by reacting a cyanate ester compound having 2 or more cyanate groups in the molecule and/or a prepolymer thereof, an epoxy resin containing at least one kind of an epoxy resin having a biphenyl structure in the molecule, and a monovalent phenol compound, and a monovalent phenol compound.

The resin composition for printed wiring board of the present invention relates to a composition obtainable by reacting a phenol-modified cyanate ester oligomer with a cyanate ester compound having 2 or more cyanate groups in the molecule and/or a prepolymer thereof and a monovalent phenol compound in the presence of a polyphenylene ether resin.

The resin composition for printed wiring board of the present invention relates to a composition obtainable by reacting an epoxy/phenol-modified cyanate ester oligomer with a cyanate ester compound having 2 or more cyanate groups in the molecule and/or a prepolymer thereof, a monovalent phenol compound and an epoxy resin containing at least one kind of an epoxy resin having a biphenyl structure in the molecule in the presence of a polyphenylene ether resin.

BEST MODE FOR CARRYING OUT THE INVENTION

In the following, the present invention is explained in more detail.

The first invention of the present invention is explained below. In the first invention of the present invention, the cyanate ester compound having 2 or more cyanate groups in the molecule and/or the prepolymer thereof is/are Component (A), the epoxy resin containing at least one kind of an epoxy resin having a biphenyl structure in the molecule is Component (B), and the monovalent phenol compound is Component (C).

The resin composition for printed wiring board which is the first invention of the present invention relates to a composition comprising (A) a cyanate ester compound having 2 or more cyanate groups in the molecule and/or a prepolymer thereof, (B) an epoxy resin containing at least one kind of an epoxy resin having a biphenyl structure in the molecule, and relates to the above-mentioned resin composition for printed wiring board which further comprises (C) a monovalent phenol compound. The first invention of the present invention relates to a varnish, a prepreg, and a metal clad laminated board using these resin compositions for printed wiring board.

Moreover, the first invention of the present invention relates to the resin composition for printed wiring board comprising a phenol-modified cyanate ester oligomer obtainable by reacting (A) a cyanate ester compound having 2 or more cyanate groups in the molecule and/or a prepolymer thereof and (C) a monovalent phenol compound, and (B) an epoxy resin containing at least one kind of an epoxy resin having a biphenyl structure in the molecule, and a varnish, a prepreg and a metal clad laminated board using the same.

Also, the first invention of the present invention relates to the resin composition for printed wiring board comprising an epoxy/phenol-modified cyanate ester oligomer obtainable by reacting (A) a cyanate ester compound having 2 or more cyanate groups in the molecule and/or a prepolymer thereof, (B) an epoxy resin containing at least one kind of an epoxy resin having a biphenyl structure in the molecule, and (C) a monovalent phenol compound, and a varnish, a prepreg and a metal clad laminated board using the same.

The first embodiment of the resin composition for printed wiring board of the present invention is a composition comprising (A) a cyanate ester compound having 2 or more cyanate groups in the molecule and/or a prepolymer thereof, and (B) an epoxy resin containing at least one kind of an epoxy resin having a biphenyl structure.

(A) The cyanate ester compound having 2 or more cyanate groups in the molecule of the present invention is not specifically limited. If two or more cyanate groups are present in the molecule, it is possible to cure the composition by cross-linking. For example, there may be mentioned a cyanate ester compound represented by the formula (I):

Formula (I)

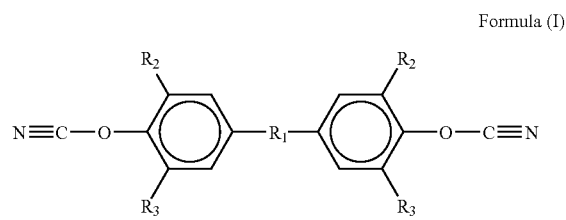

wherein $R_1$ represents

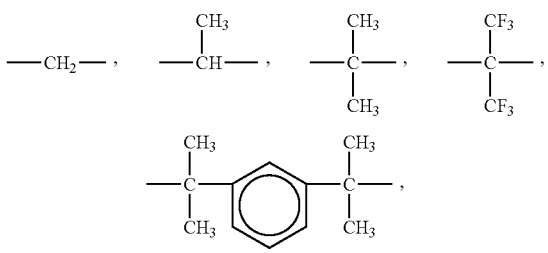

or

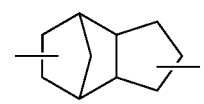

$R_2$ and $R_3$ each represent a hydrogen atom or an alkyl group having 1 to 4 carbon atoms, and each may be the same or different from each other, and a cyanate ester compound represented by the formula (II):

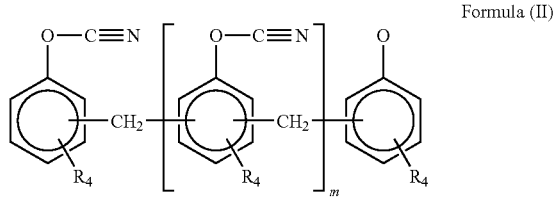

Formula (II)

wherein $R_4$ represents a hydrogen atom or an alkyl group having 1 to 4 carbon atoms, m represents an integer of 1 to 7.

A prepolymer of the cyanate ester compound having 2 or more cyanate groups in the molecule of Component (A) of the present invention is not specifically limited. Here, the prepolymer means a cyanate ester oligomer in which cyanate ester compounds form a triazine ring by cyclization reaction, and may be mentioned mainly 3, 5, 7, 9 and 11-oligomers of the cyanate ester compounds. In the prepolymer, a conversion rate of the cyanate group is not specifically limited, and a prepolymer in which they are converted generally in the range of 20 to 70% is preferably used, more preferably 30 to 65%. For example, there may be mentioned a prepolymer of the cyanate ester compound represented by the formula (I) or (II).

Preferred examples of Component (A) of the present invention may be mentioned 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropyl-benzene, a cyanate ester compound of a phenol-added dicyclopentadiene polymer, a phenol novolac type cyanate ester compound and a cresol novolac type cyanate ester compound, and a prepolymer thereof, etc., and preferably 2,2-bis(4-cyanatophenyl)propane, α,α'-bis(4-cyanatophenyl)-m-diisopropylbenzene, bis(3,5-dimethyl-4-cyanatophenyl)-methane, and a prepolymer thereof. They may be used alone or in combination of two or more kinds.

The epoxy resin containing at least one kind of (B) an epoxy resin containing a biphenyl structure of the present invention is not specifically limited so long as it contains an epoxy resin containing a biphenyl structure as an essential component. For example, it may be either of an epoxy resin comprising one kind of an epoxy resin containing a biphenyl structure, an epoxy resin comprising two or more kinds of epoxy resins containing a biphenyl structure, or an epoxy resin comprising a combination of at least one kind of an epoxy resin containing a biphenyl structure and at least one kind of another epoxy resin. Incidentally, an epoxy resin having a biphenyl skeleton and other skeleton is classified into an epoxy resin containing a biphenyl structure in the present invention.

The epoxy resin containing a biphenyl structure is not specifically limited, and may be mentioned, for example, an epoxy resin represented by the formula (III):

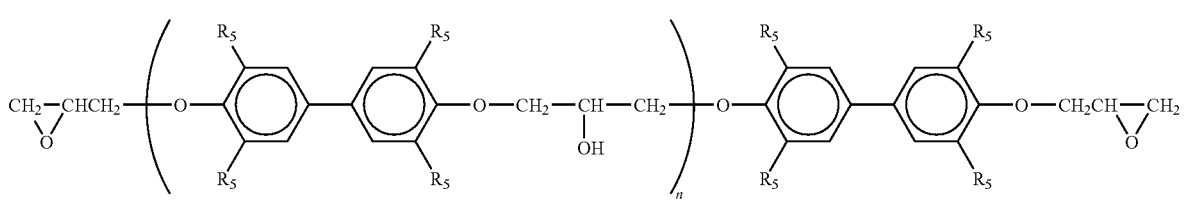

Formula (III)

wherein $R_5$ each represent a hydrogen atom or a methyl group, n represents an integer of 0 to 6,
and an epoxy resin represented by the formula (IV):

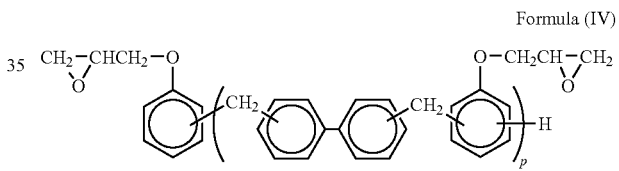

Formula (IV)

wherein p represents an integer of 1 to 5.

In the epoxy resin represented by the formula (III), n is preferably 0 to 5, more preferably 0 to 3, more preferably 0 or 1, particularly preferably 0. Also, a mixture of epoxy resins of the formula (III) in which values of n are different from each other may be used. There may be specifically mentioned biphenol diglycidyl ether, and 3,3',5,5'-tetramethylbiphenol diglycidyl ether, etc., and as the epoxy resin represented by the formula (IV), there may be mentioned a biphenyl aralkylene novolac type epoxy resin. Also, a mixture of epoxy resins of the formula (IV) in which values of p are different from each other may be used. These epoxy resins containing a biphenyl structure may be used alone or in combination of two or more kinds. In addition, as these epoxy resins containing a biphenyl structure, the epoxy resin of the formula (III) is more preferred than that of the formula (IV) since the former is advantageous in cost, and strength and dielectric characteristics of the cured product are slightly excellent.

When Component (B) of the present invention is a component in which at least one of the epoxy resin containing a biphenyl structure and at least one of an epoxy resin other than the epoxy resin containing a biphenyl structure are combined, the other epoxy resin is not specifically limited, and there may be mentioned, for example, a bisphenol A type epoxy resin, a bisphenol F type epoxy resin, a brominated bisphenol A type epoxy resin, a phenol novolac type epoxy resin, a cresol novolac type epoxy resin, a brominated phenol novolac type epoxy resin, a bisphenol A novolac type epoxy resin, a naphthalene skeleton-containing epoxy resin, an aralkylene skeleton-containing epoxy resin, a phenol salicylic aldehyde novolac type epoxy resin, a lower alkyl group-substituted phenol salicylic aldehyde novolac type epoxy resin and a dicyclopentadiene skeleton-containing epoxy resin, etc. Of these, a phenol novolac type epoxy resin and a cresol novolac type epoxy resin are suitably used in combination in view of high glass transition temperature (Tg) and cost, and for the purpose of providing flame resistance, a brominated bisphenol A type epoxy resin and a brominated phenol novolac type epoxy resin, etc. are suitably used in combination.

A formulation amount of Component (B) of the present invention is preferably 10 to 250 parts by weight based on 100 parts by weight Component (A) in view of humidity resistance under severe conditions, improvement in heat resistance, strength and elongation at the time of absorbing moisture, and dielectric characteristics at high frequency band region. A formulation amount of Component (B) is more preferably 10 to 150 parts by weight, particularly preferably 10 to 100 parts by weight. In view of dielectric characteristics, a ratio of the epoxy resin containing a biphenyl structure in Component (B) is preferably 50% by weight or more, more preferably 70% by weight or more, particularly preferably 100% by weight, that is, whole of Component (B) is an epoxy resin containing a biphenyl structure.

To the resin composition of the first embodiment, (C) a monovalent phenol compound may be formulated. By formulating Component (C), an amount of an unreacted cyanate group in the cured product can be reduced, so that it is preferred in the points of humidity resistance and dielectric characteristics.

Component (C) of the present invention is not specifically limited, and there may be mentioned, for example, a monovalent phenol compound represented by the formula (V):

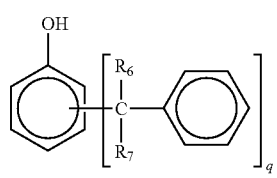

Formula (V)

wherein $R_6$ and $R_7$ each represent a hydrogen atom or a methyl group, each may be the same or different from each other, and q represents an integer of 1 to 3, and a monovalent phenol compound represented by the formula (VI):

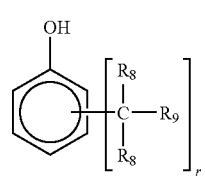

Formula (VI)

wherein $R_8$ represents a hydrogen atom or a methyl group, $R_9$ represents

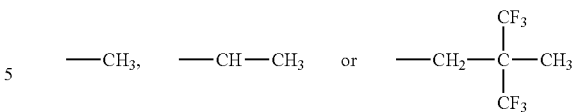

and r represents an integer of 1 or 2.

As the monovalent phenol compound represented by the formula (V), there may be mentioned p-(α-cumyl)phenol, mono-, di- or tri-(α-methylbenzyl)phenol. As the mono-valent phenol compound represented by the formula (VI), there may be mentioned p-tert-butylphenol, 2,4- or 2,6-di-tert-butylphenol, p-tert-amylphenol and p-tert-octylphenol. These monovalent phenol compounds may be used alone or in combination of two or more kinds.

A formulation amount of Component (C) of the present invention is preferably in the range of 2 to 60 parts by weight based on 100 parts by weight of Component (A), more preferably 3 to 45 parts by weight, particularly preferably 4 to 30 parts by weight. When Component (C) is formulated in this range, it is preferred in the point of dielectric characteristics, in particular, a product having a sufficiently low dielectric dissipation factor particularly at a high frequency band region can tend to be obtained, and sufficient effects can be obtained in the point of humidity resistance, and there is a tendency of not exerting bad effect on heat resistance, etc. at the time of absorbing moisture.

To the resin composition of the first embodiment, a metal series catalyst is preferably formulated. The metal series catalyst acts as a promoting agent of a self-polymerization reaction of Component (A), and in the reaction of Component (A) and Component (C) when Component (C) is formulated, and as a curing accelerator at the time of producing laminated boards, and there may be mentioned, for example, a metal salt or chelate complex of a transition metal or a metal belonging to Group 12. As the metal, there may be mentioned, for example, copper, cobalt, manganese, iron, nickel, zinc, etc., and as the salt thereof, there may be mentioned, for example, a metal salt such as a carboxylate (preferably 2-ethylhexanoate, naphthenate), etc., and as the chelate complex, there may be mentioned, for example, an acetylacetone complex. These metal series catalysts may be used alone or in combination of two or more kinds. Also, the promoting agent in the self-polymerization reaction of Component (A), and in the reaction of Component (A) and Component (C), and the curing accelerator at the time of producing laminated boards may be the same or different metal series catalyst from each other.

An amount of the metal series catalyst is preferably 1 to 300 ppm based on the amount of Component (A) in terms of weight, more preferably 1 to 200 ppm, particularly preferably 2 to 150 ppm. When the a metal series catalyst is formulated in this range, reactivity and curing property is sufficient, and curing rate is suitable. Addition of the metal series catalyst may be carried out at once or may be divided into a plural number of times.

In the resin composition of the first embodiment, a compound which has a catalytic function of promoting the reaction of a glycidyl group of Component (B) may be formulated. More specifically, there may be mentioned an alkali metal compound, an alkaline earth metal compound, an imidazole compound, an organic phosphorus compound, a secondary amine, a tertiary amine, a quaternary ammonium salt and the like. These compounds may be used alone or in combination of two or more kinds.

In the resin composition of the first embodiment, if necessary, an additive such as a flame retardant, a filler, etc. may be formulated in a range which does not worsen dielectric characteristics or characteristics such as heat resistance, etc. of the cured product.

The flame retardant to be formulated depending on necessity is not specifically limited, and is preferably a flame retardant having no reactivity with a cyanate group. Here, the terms having no reactivity with a cyanate group mean that a flame retardant is added to a resin composition for printed wiring board, even when they are mixed in a range of 300° C. or lower, the flame retardant does not react with a cyanate group of the cyanate ester compound and is to be contained in a resin composition for printed wiring board as such in a dispersed or dissolved state. In this reaction, a reaction of a flame retardant when the resin composition is burned under heating is not included. In general, production and use of the resin composition for printed wiring board, and the varnish, prepreg, metal clad laminated board, printed wiring board, etc. using the same are carried out in the range of 300° C. or lower.

As such a flame retardant, there may be mentioned a flame retardant substantially having no alcoholic hydroxyl group, phenolic hydroxyl group, amino group or maleimide group, which are known as a group which reacts with a cyanate group. Here, the terms "substantially having no" include the case where the flame retardant never contains these groups and the case where even when the flame retardant contains these groups but there is no interaction with the cyanate ester compound (for example, it is the case where the flame retardant is a polymer having a large molecular weight, and these groups exist at the end of the molecule, so that there is no effect as a functional group).

Incidentally, with regard to a flame retardant classified into an epoxy resin including a brominated epoxy resin such as a brominated bisphenol A type epoxy resin and a brominated phenol novolac type epoxy resin, etc., it is classified in Component (B) in the present invention. Provided that, a flame retardant classified into an epoxy compound having only one glycidyl group reacts with a cyanate ester compound, and can be inserted into a triazine ring or an isocyanuric ring, but if it is a suitable formulation amount, effects on dielectric characteristics are considered to be little so that it may be used as a flame retardant.

Specific flame retardant may be mentioned, for example, 1,2-dibromo-4-(1,2-dibromoethyl)cyclohexane, tetrabromocyclooctane, hexabromocyclododecane, bis(tri-bromophenoxy)ethane, a brominated polyphenylene ether, brominated polystyrene, and a brominated triphenylcyanurate flame retardant represented by the formula (VII):

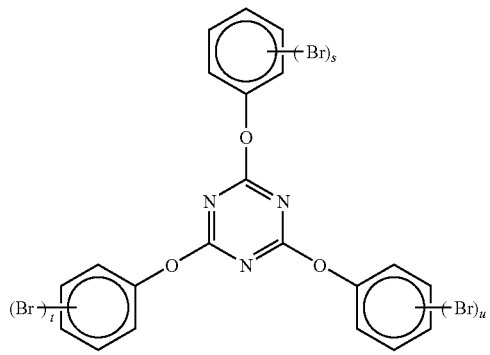

Formula (VII)

wherein s, t and u each represent an integer of 1 to 5, and each may by the same value or different from each other, and the like, and in the point of dielectric characteristics, 1,2-dibromo-4-(1,2-dibromoethyl)cyclohexane, tetra-bromocyclooctane, hexabromocyclododecane and 2,4,6-tris-(tribromophenoxy)-1,3,5-triazine are preferred.

A formulation amount of the flame retardant is preferably set to 5 to 100 parts by weight based on 100 parts by weight of Component (A), Component (B) and Component (C) (when they are formulated) in total, more preferably 5 to 80 parts by weight, particularly preferably 5 to 60 parts by weight. When it is formulated in this range, heat resistance is sufficient in the resin composition, and heat resistance of the cured product is also preferred.

The filler to be formulated depending on necessity is not specifically limited, it is usually an inorganic filler, and there may be mentioned, for example, alumina, titanium oxide, mica, silica, beryllia, barium titanate, potassium titanate, strontium titanate, calcium titanate, aluminum carbonate, aluminum hydroxide, aluminum silicate, potassium carbonate, calcium silicate, magnesium silicate, silicon nitride, boron nitride, clay (calcined clay, etc.), talc, aluminum borate, aluminum borate, silicon carbide, etc. These inorganic fillers may be used alone or in combination of two or more kinds. Also, a shape, a particle size, etc. of the inorganic filler are not specifically limited, and it is usually having a particle size of 0.01 to 50 μm, preferably those having 0.1 to 15 μm. Moreover, a formulation amount of these inorganic filler is not specifically limited, and is preferably 1 to 1000 parts by weight based on 100 parts by weight of Component (A), Component (B) and Component (C) (when they are formulated) in total, more preferably 1 to 800 parts by weight.

The resin composition of the first embodiment can be produced by formulating Component (A), Component (B) and occasionally Component (C) or other additive(s) by the conventionally known method, and mixing.

The second embodiment of the resin composition for printed wiring board of the present invention comprises a composition containing a phenol-modified cyanate ester oligomer obtained by reacting (A) a cyanate ester compound having 2 or more cyanate groups in the molecule and/or a prepolymer and (C) a monovalent phenol compound, and an epoxy resin containing at least one kind of (B) an epoxy resin containing a biphenyl structure. By previously modifying Component (A) with phenol and formulating an epoxy resin which contains an epoxy resin having a biphenyl structure, an amount of the cyanate group remained in the cured product can be reduced, and humidity resistance and dielectric characteristics can be more improved.

The phenol-modified cyanate oligomer becomes a mixed oligomer comprising, for example, a cyanate ester oligomer in which Component (A) solely forms a triazine ring by cyclization reaction, an imidecarbonated-modified oligomer in which a phenolic hydroxyl group of Component (C) is added to a cyanate group of Component (A), and/or a modified oligomer (in this case, among the three chains extended from the triazine ring, one or two thereof is/are replaced by the molecule derived from Component (C)) in which one or two of Component (C) is introduced into the structure of a triazine ring formed by sole cyclization of Component (A).

With regard to examples of Component (A) to be used for formation of the phenol-modified cyanate ester oligomer and examples of Component (C), and examples of Component (B), descriptions of Component (A), Component (C), and Component (B) with regard to the first embodiment are applied to.

Component (C) to be used for formation of the phenol-modified cyanate ester oligomer is preferably within the range of 2 to 60 parts by weight based on 100 parts by weight of Component (A), more preferably 3 to 45 parts by weight, particularly preferably 4 to 30 parts by weight.

A formulation amount of Component (B) of the present invention is preferably 10 to 250 parts by weight based on 100 parts by weight of Component (A) to be used for formation of the phenol-modified cyanate ester oligomer, more preferably 10 to 150 parts by weight, particularly preferably 10 to 100 parts by weight. In the point of dielectric characteristics, a ratio of the epoxy resin containing a biphenyl structure in Component (B) is preferably 50% by weight or more, more preferably 70% by weight or more, particularly preferably 100% by weight, i.e., all the Component (B) is the epoxy resin containing a biphenyl structure.

The resin composition of the second embodiment may further contain Component (C), and in such a case, a sum of said Component (C), and Component (C) to be used for formation of the phenol-modified cyanate ester oligomer is preferably within the range of 2 to 60 parts by weight based on 100 parts by weight of Component (A). For example, Component (C) is previously reacted in the range of 0.4 parts by weight or more and less than 60 parts by weight based on 100 parts by weight of Component (A) to prepare a phenol-modified cyanate ester oligomer, and then, Component (C) is additionally formulated so that a sum of the amount thereof with that of Component (C) to be used for formation of the phenol-modified cyanate ester oligomer becomes within the range of 2 to 60 parts by weight. When Component (C) is previously reacted in the range of 2 to 60 parts by weight based on 100 parts by weight of Component (A) to obtain a phenol-modified cyanate ester oligomer, additional Component (C) may not be formulated, or may be formulated so that a sum of the amount thereof with that of Component (C) to be used for formation of the phenol-modified cyanate ester oligomer becomes within the range of 2 to 60 parts by weight. Incidentally, in the abovementioned case, Component (C) to be used for formation of the phenol-modified cyanate ester oligomer, and additional Component (C) may be the same or different from each other, and each may be used in combination of two or more kinds in admixture.

The phenol-modified cyanate ester oligomer can be prepared, for example, Component (A) and Component (C) are mixed in a solvent such as toluene, xylene, mesitylene, etc., and heating to 70 to 120° C. for 0.5 to 10 hours. At this time, the metal series catalyst described in the first embodiment may be added to the mixture. These metal series catalysts are to promote modification by phenol. Incidentally, the phenol-modified cyanate ester oligomer can be made, for example, a conversion of the initial cyanate group of 20 to 70%, preferably in the range of 30 to 65%.

The resin composition of the second embodiment can be obtained by formulating Component (B) to the phenol-modified cyanate ester oligomer obtained as mentioned above, and if necessary, Component (C) is further formulated to the mixture. To the above composition, similarly as in the resin composition of the first embodiment, a metal series catalyst, a compound having a catalytic function which promotes the reaction of a glycidyl group of the epoxy resin, a flame retardant, a filler, other additives, etc. may be formulated, and with regard to specific examples, preferred examples, formulation amounts, and a preparation method of the resin composition, the descriptions with regard to the first embodiment can be similarly applied to.

The third embodiment of the resin composition for printed wiring board of the present invention is a composition containing (A) a cyanate ester compound having 2 or more cyanate groups in the molecule and/or a prepolymer thereof, (B) an epoxy resin containing at least one kind of an epoxy resin containing a biphenyl structure, and (C) an epoxy/phenol-modified cyanate ester oligomer obtained by reacting a monovalent phenol compound. By carrying out phenol-modification and epoxy-modification, a desired melting viscosity can be provided, an amount of the cyanate group remained in the cured product is reduced, and improvement in humidity resistance and dielectric characteristics can be accomplished.

Examples of Component (A), Component (B) and Component (C) to be used for formation of the epoxy/phenol-modified cyanate ester oligomer, the descriptions of Component (A), Component (B) and Component (O) with regard to the first embodiment can be applied to. For formation of the epoxy/phenol-modified cyanate ester oligomer, Component (B) is preferably 10 to 250 parts by weight based on 100 parts by weight of Component (A), more preferably 10 to 150 parts by weight, particularly preferably 10 to 100 parts by weight. In the point of dielectric characteristics, a ratio of the epoxy resin containing a biphenyl structure in Component (B) is preferably 50% by weight or more, more preferably 70% by weight or more, particularly preferably 100% by weight, i.e., all the Component (B) is the epoxy resin containing a biphenyl structure. In the formation of the epoxy/phenol-modified cyanate ester oligomer, Component (C) is preferably within the range of 2 to 60 parts by weight based on 100 parts by weight of Component (A), more preferably 3 to 45 parts by weight, particularly preferably 4 to 30 parts by weight.

The resin composition of the third embodiment may contain further Component (C), and in such a case, a sum of said Component (C), and Component (C) to be used for formation of the epoxy/phenol-modified cyanate ester oligomer is preferably within the range of 2 to 60 parts by weight based on 100 parts by weight of Component (A). For example, 10 to 250 parts by weight of Component (B) and 0.4 parts by weight or more and less than 60 parts by weight of Component (C) based on 100 parts by weight of Component (A) are provisionally reacted to prepare an epoxy/phenol-modified cyanate ester oligomer, Component (C) may be additionally formulated in such an amount that a sum of the same with Component (C) to be used for formation of the epoxy/phenol-modified cyanate ester oligomer becomes within the range of 2 to 60 parts by weight. Component (C) to be used for formation of the epoxy/phenol-modified cyanate ester oligomer, and additional Component (C) may be the same or different from each other, and each may be used in combination of two or more kinds in admixture.

The epoxy/phenol-modified cyanate ester resin composition can be prepared by, for example, dissolving Component (A), Component (B) and Component (C) in a solvent such as toluene, xylene, mesitylene, etc., and heating at 70 to 120° C. for 0.5 to 10 hours. At this time, the metal series catalyst described in the first embodiment may be added. These metal series catalysts are to promote modification by phenol. Incidentally, the epoxy/phenol-modified cyanate ester oligomer may be made, for example, a conversion of the initial cyanate group of 20 to 70%, preferably within the range of 30 to 65%.

To the resin composition of the third embodiment, similarly as in the resin composition of the first embodiment, a metal series catalyst, a compound having a catalytic function which promotes the reaction of a glycidyl group of the epoxy resin, a flame retardant, a filler, other additives, etc. may be formulated, and with regard to specific examples, preferred examples, formulation amounts, and a preparation method of the resin composition, the descriptions with regard to the first embodiment can be similarly applied to.

By using the resin composition for printed wiring board of the first to the third embodiment according to the present invention, a prepreg for a printed wiring board or a metal clad laminated board can be produced according to the conventionally known method. For example, the resin composition for printed wiring board of the present invention is as such, or in a form of a varnish in which they are dissolved or dispersed in a solvent, impregnated into a substrate such as a glass cloth, etc., and then, drying in a drying oven usually at a temperature of 80 to 200° C. (provided that, when a solvent is used, it is set at a temperature capable of volatilizing the solvent or higher), preferably at 100 to 180° C., for 3 to 30 minutes, preferably 3 to 15 minutes to obtain a prepreg. Then, this prepreg is laminated with a plural number of sheets, a metal foil(s) is/are provided on one surface or both surfaces thereof, and molding under heating to produce a both surface or one surface metal clad laminated board.

Incidentally, the solvent to be used in the abovementioned varnishing treatment is not specifically limited, and there may be mentioned a solvent, for example, alcohols such as methanol, ethanol, ethylene glycol, ethylene glycol monomethyl ether, etc., ketones such as acetone, methyl ethyl ketone, methyl isobutyl ketone, cyclohexanone, etc., aromatic hydrocarbons such as toluene, xylene, mesitylene, etc., esters such as methoxyethyl acetate, ethoxyethyl acetate, butoxyethyl acetate, ethyl acetate, etc., amides such as N-methylformamide, N,N-dimethylformamide, N,N-dimethylacetamide, N-methylpyrrolidone, etc. In particular, aromatic hydrocarbons such as toluene, xylene, mesitylene, etc. are more preferred. They may be used alone or in combination of two or more kinds.

The resin composition for printed wiring board of the present invention, and the varnish, prepreg and metal clad laminated board using the same can be used for a printed wiring board which can be used for information communication-related devices (parts such as a filter, VCO, etc. included in mobile communication devices, or signal processor, power amplifier and antenna which constitutes wireless base station equipments, or a high speed computer which exceeds a clock frequency of 1 GHz such as a server, router and microprocessor, etc.) which are required to have higher frequencies and high speed in signals.

The second invention of the present invention is explained below. In the second invention of the present invention, a cyanate ester compound having 2 or more cyanate groups in the molecule and/or a prepolymer thereof is/are Component (a), an epoxy resin containing at least one kind of an epoxy resin having a biphenyl structure in the molecule is Component (d), a polyphenylene ether resin is Component (c), a monovalent phenol compound is Component (b), a flame retardant is Component (e), and an antioxidant is Component (f).

The second invention of the present invention relates to a resin composition for printed wiring board obtained by using (a) a cyanate ester compound having 2 or more cyanate groups in the molecule and/or a prepolymer thereof, (b) a monovalent phenol compound, (c) a polyphenylene ether resin, and (d) an epoxy resin containing at least one kind of an epoxy resin having a biphenyl structure in the molecule, and a varnish, a prepreg and a metal clad laminated board using the same.

Also, the second invention of the present invention relates to a resin composition for printed wiring board containing Components (a) to (d), and a varnish, a prepreg and a metal clad laminated board using the same.

Moreover, the second invention of the present invention relates to a resin composition for printed wiring board containing a phenol-modified cyanate ester oligomer obtained by reacting Component (a) and Component (b), Component (c), and Component (d), and a varnish, a prepreg and a metal clad laminated board using the same.

Also, the present invention relates to a resin composition for printed wiring board containing Component (a), an epoxy/phenol-modified cyanate ester oligomer obtained by reacting Component (b) and Component (d), and Component (c), and a varnish, a prepreg and a metal clad laminated board using the same.

The resin composition for printed wiring board which is the second invention of the present invention relates to a composition obtained by using (a) a cyanate ester compound having 2 or more cyanate groups in the molecule and/or a prepolymer thereof, (b) a monovalent phenol compound, (c) a polyphenylene ether resin, and (d) an epoxy resin containing at least one kind of an epoxy resin having a biphenyl structure in the molecule. The first embodiment of the resin composition for printed wiring board according to the present invention is a resin composition for printed wiring board containing Components (a) to (d).

With regard to examples of Component (a) of the second invention of the present invention, the descriptions of Component (A) of the first invention of the present invention can be applied to.

Component (a) of the present invention is preferably a compound represented by the formula (I) and its prepolymer in the point of dielectric characteristics, and preferably a compound represented by the formula (II) having high Tg in the point of heat resistance. These may be selected depending on the desired characteristics, and when they are used in combination, a formulation ratio can be optionally adjusted.

The cyanate ester compound and a prepolymer thereof represented by the formula (I) of the present invention may be mentioned 2,2-bis(4-cyanatophenyl)propane, bis(4-cyanatophenyl)ethane, bis(3,5-dimethyl-4-cyanatophenyl)-methane, 2,2-bis(4-cyanatophenyl)-1,1,1,3,3,3-hexafluoropropane, α,α'-bis(4-cyanatophenyl)-m-diisopropylbenzene, a cyanate ester compound of a phenol-added dicyclopentadiene polymer and a prepolymer thereof, and the cyanate ester compound represented by the formula (II) and a prepolymer thereof may be mentioned a phenol novolac type cyanate ester compound and a cresol novolac type cyanate ester compound and a prepolymer thereof, etc. They may be used alone or in combination of two or more kinds.

(b) The monovalent phenol compound of the present invention is not specifically limited. By formulating Component (b), a triazine ring can be effectively formed at the time of curing, and the cyanate group remained in the cured product as an unreacted material is imidecarbonated to reduce its polarity, whereby dielectric constant or dielectric dissipation factor of the cured product can be lowered. In the curing reaction of a usual cyanate ester sole system, a triazine ring always has three cyanate groups, so that accompanying with the progress of the reaction, the triazine ring becomes necessarily cross-linking point. In curing of the resin composition according to the present invention, one or two molecules of Component (b) is/are incorporated into a constitutional component of the triazine ring, so that a cyanate group extending from the triazine ring becomes one or two whereby the triazine ring is not necessarily a cross-linking point. That is, as compared with the cured product of the cyanate ester sole system, it becomes a cured product having characteristics that a molecular weight between the cross-linking points is large and a cross-linking density is small. According to this curing reaction, the molecular weight between the cross-linking points is large so that mobility of the molecular chain is increased and reactivity of the cyanate group becomes high, and even when the reaction proceeds, increase in viscosity is little. Accordingly, a time until the reaction system lost fluidity becomes long whereby the triazine ring can be effectively formed. As a result, an amount of the cyanate group remained in the cured produce is lowered, so that dielectric characteristics become good. Component (b) is not particularly limited so long as it is suitable for this object, and a monovalent phenol compound which is mono-functional, relatively low molecular weight and miscibility with the cyanate ester resin is good is considered to be suitable.

With regard to examples of Component (b) of the second invention according to the present invention, descriptions of Component (C) of the first invention of the present invention can be applied to.

(c) The polyphenylene ether resin of the present invention is not specifically limited. By formulating Component (c), improvement in dielectric characteristics can be further realized. Incidentally, the cyanate ester compound and the polyphenylene ether resin are inherently immiscible system and a uniform resin can be difficulty obtained, but in the present invention, it is possible to obtain a uniform resin by the so-called "formation of semi-IPN" by presenting a polyphenylene ether at the time of curing, and at the time of modification of Component (a) by Component (b). Compatibilization (uniformerization) at this time is not to form chemical bond(s) by the respective component(s), but a curing component becomes oligomerization in which a curing component(s) is/are involved in molecular chain(s) of the polymer of the polyphenylene ether resin, and finally existing as resins compatibilized with each other. As described above, in the present invention, Component (b) is formulated in Component (a), so that the molecular weight between the cross-linking points of the cured product becomes large, and the curing component and the polyphenylene ether are easily involved with each other, whereby improvement in solubility can be found out.

Component (c) of the present invention may be mentioned, for example, poly(2,6-dimethyl-1,4-phenylene)-ether, an alloy polymer comprising poly(2,6-dimethyl-1,4-phenylene) ether and an alloy polymer comprising polystyrene, poly(2,6-dimethyl-1,4-phenylene)ether and a styrene-butadiene copolymer and the like. When an alloy polymer comprising poly(2,6-dimethyl-1,4-phenylene)ether and polystyrene, and an alloy polymer comprising poly(2,6-dimethyl-1,4-phenylene)ether and styrene-butadiene copolymer and the like is used, and a polymer containing 50% or more of the poly(2,6-dimethyl-1,4-phenylene)ether component is preferred.

With regard to examples of Component (d) of the second invention according to the present invention, descriptions of Component (B) of the first invention of the present invention can be applied to.

In the resin composition of the first embodiment, preferred ranges of formulation amounts of Components (a) to (d) are as mentioned below.

A formulation amount of Component (b) of the present invention is preferably 2 to 60 parts by weight based on 100 parts by weight of Component (a), more preferably 3 to 45 parts by weight, particularly preferably 4 to 30 parts by weight. When Component (b) is formulated in this range, in particular, good dielectric characteristics that dielectric dissipation factor at high frequency band region is sufficiently low can be obtained, and, good heat resistance at humidity conditions can be obtained.

A formulation amount of Component (c) of the present invention is preferably 5 to 300 parts by weight based on 100 parts by weight of Component (a), more preferably 10 to 200 parts by weight, particularly preferably 15 to 100 parts by weight. When a formulation amount of Component (c) is in this range, sufficient dielectric characteristics can be obtained, and a melt viscosity of the resin is suitable so that a fluidity is sufficient and molding property is good, and there is a tendency that a reactivity of Component (a) is also good.

A formulation amount of Component (d) of the present invention is preferably 10 to 250 parts by weight based on 100 parts by weight of Component (a) in the points of humidity resistance under severe conditions, heat resistance or strength at the time of humid conditions and improvement in elongation, etc., and dielectric characteristics at high frequency band region. A formulation amount of Component (d) is more preferably 10 to 150 parts by weight, particularly preferably 10 to 100 parts by weight. In the point of dielectric characteristics, a ratio of the epoxy resin containing a biphenyl structure in Component (d) is preferably 50% by weight or more, more preferably 70% by weight or more, particularly preferably 100% by weight, i.e., all the Component (d) is the epoxy resin containing a biphenyl structure.

To the resin composition of the first embodiment, (e) a flame retardant can be added. Component (e) is not specifically limited, and a flame retardant having no reactivity with a cyanate group is preferred. Here, the terms of having no reactivity with a cyanate group mean that a flame retardant is added to a resin composition for printed wiring board, the flame retardant does not react with the cyanate group of a cyanate ester compound even when they are mixed in the range of 300° C. or lower, and contained in a resin composition for printed wiring board as such in the state of a dispersion or dissolution. In this reaction, a reaction(s) of the flame retardant at the time of heating and burning the resin composition is/are not included. In general, production and use of the resin composition for printed wiring board, and the varnish, prepreg, metal clad laminated board and printed wiring board, etc. using the same are carried out within the range of 300° C. or lower.

As such a flame retardant, there may be mentioned a flame retardant substantially having no alcoholic hydroxyl group, phenolic hydroxyl group, amino group or maleimide group, which are known as a group which reacts with a cyanate group. Here, the terms "substantially having no" include the case where the flame retardant never contains these groups and the case where even when the flame retardant contains these groups but there is no interaction with the cyanate ester compound (for example, it is the case where the flame retardant is a polymer having a large molecular weight, and these groups exist at the end of the molecule, so that there is no effect as a functional group).

Incidentally, with regard to a flame retardant classified into an epoxy resin including a brominated epoxy resin such as a brominated bisphenol A type epoxy resin and a brominated phenol novolac type epoxy resin, etc., it is classified in Component (d) in the present invention. Provided that, a flame retardant classified into an epoxy compound having a glycidyl group reacts with a cyanate ester compound, and can be inserted into a triazine ring or an isocyanuric ring, but if it is a suitable formulation amount, effects on dielectric characteristics are considered to be little so that it may be used as a flame retardant.

With regard to examples of specific flame retardants of the second invention according to the present invention, descriptions of the flame retardant of the first invention according to the present invention can be applied to.

A formulation amount of the flame retardant is preferably 5 to 100 parts by weight based on the total amount of Components (a) to (d) as 100 parts by weight, more preferably 5 to 80 parts by weight, particularly preferably 5 to 60 parts by weight. By formulating it in this range, flame resistance is sufficient in the resin composition, and it is preferred for heat resistance of the cured product.

To the resin composition of the first embodiment, (f) an antioxidant may be added. By formulating the anti-oxidant, when the resin composition for printed wiring board is cured and fabricated to laminated boards, etc., occurrence of metal migration can be controlled and further improvement in insulation reliability can be established.

Component (f) of the present invention is not specifically limited, and a phenol type antioxidant and a sulfur type antioxidant are preferably used. Incidentally, it has been well known for those skilled in the art that the antioxidant is classified from the skeletal structure, and for example, in "Antioxidant Handbook" pp. 12 to 17 (1976), specific antioxidants are exemplified as a classification of "a phenol type antioxidant" and "a sulfur type antioxidant".

Specific examples of the phenol type antioxidant may include a monophenol type one such as pyrogallol, butylated hydroxyanisole, 2,6-di-tert-butyl-4-methylphenol, etc., a bisphenol type one such as 2,2'-methylene-bis-(4-methyl-6-tert-butylphenol), 4,4'-butylidenebis(3-bis-6-tert-butylphenol), etc. and a polymer type phenol series one such as 1,3,5-trimethyl-2,4,6-tris(3,5-di-tert-butyl-4-hydroxy-benzyl) benzene, tetrakis-[methylene-3-(3'-5'-di-tert-butyl-4'-hydroxyphenyl)propionate]methane, etc. Specific examples of the sulfur series antioxidant may include dilaurylthiodipropionate, distearylthiodipropionate, etc. These antioxidants may be used alone or in admixture of two or more.

A formulation amount of Component (f) of the present invention is preferably 0.1 to 20 parts by weight based on the total amount of Components (a) to (d) as 100 parts by weight, more preferably 0.1 to 10 parts by weight, particularly preferably 0.1 to 5 parts by weight. If it is formulated in this range, a preferred resin composition for printed wiring board can be obtained in the points of improved effects I insulation reliability of the cured product or laminated boards.

In the resin composition of the first embodiment, a metal series catalyst is preferably formulated. The metal series catalyst acts as a promoting agent of a self-polymerization reaction of Component (a), in the reaction of Component (a) and Component (b), and in the reaction of Component (a) and Component (d), and as a curing accelerator at the time of producing laminated boards, and there may be mentioned, for example, a metal salt or chelate complex of a transition metal or a metal belonging to Group 12. With regard to examples of the metal of the metal series catalyst, examples of the metal series catalyst and a formulation amount thereof in the second invention of the present invention, descriptions with regard to the metal series catalyst of the first invention according the present invention can be applied to.

In the resin composition of the first embodiment, a compound having a catalytic function which promotes the reaction of the glycidyl group of Component (d) can be formulated. More specifically, there may be mentioned, an alkali metal compound, an alkaline earth metal compound, an imidazole compound, an organic phosphorus compound, a secondary amine, a tertiary amine, a quaternary ammonium salt, etc. These compounds may be used alone or in combination of two or more kinds.

In the resin composition of the first embodiment, an additie such as a filler, etc. may be formulated within a range which does not worsen characteristics such as dielectric characteristics or heat resistance, etc. of the cured product.

The filler to be formulated depending on necessity is not specifically limited, and generally an inorganic filler is suitably used. With regard to examples of the filler of the second invention according to the present invention, descriptions of the filler of the first invention according to the present invention can be applied to. Moreover, a formulation amount of the inorganic filler is not specifically limited, and is preferably 1 to 1000 parts by weight based on 100 parts by weight of Components (a) to (d) in total, more preferably 1 to 800 parts by weight.

The resin composition of the first embodiment can be produced by formulating and mixing Components (a) to (d) and other additives by the conventionally known method.

The second embodiment of the present invention is a composition containing a phenol-modified cyanate ester oligomer obtained by reacting (a) a cyanate ester compound having 2 or more cyanate groups in the molecule and/or a prepolymer and (b) a monovalent phenol compound, (c) a polyphenylene ether resin, and (d) an epoxy resin containing at lest one kind of an epoxy resin containing a biphenyl structure.

The phenol-modified cyanate oligomer becomes a mixed oligomer comprising, for example, a cyanate ester oligomer in which Component (a) solely forms a triazine ring by cyclization reaction, an imidecarbonated-modified oligomer in which a phenolic hydroxyl group of Component (b) is added to a cyanate group of Component (a), and/or a modified oligomer (in this case, among the three chains extended from the triazine ring, one or two thereof is/are replaced by the molecule derived from Component (b)) in which one or two of Component (b) is introduced into the structure of a triazine ring formed by sole cyclization of Component (a).

With regard to examples of Component (a) and Component (b) to be used for formation of the phenol-modified cyanate ester oligomer, and examples of Component (c) and Component (d), descriptions of Components (a) to (d) with regard to the first embodiment can be applied to.

Component (b) to be used for formation of the phenol-modified cyanate ester oligomer is preferably 2 to 60 parts by weight based on 100 parts by weight of Component (a), more preferably 3 to 45 parts by weight, particularly preferably 4 to 30 parts by weight.

A formulation amount of Component (c) of the present invention is preferably 5 to 300 parts by weight based on 100 parts by weight of Component (a) to be used for formation of the phenol-modified cyanate ester oligomer, more preferably 10 to 200 parts by weight, particularly preferably 15 to 100 parts by weight, and a formulation amount of Component (d) is preferably 10 to 250 parts by weight, more preferably 10 to 150 parts by weight, particularly preferably 10 to 100 parts by weight. In the point of dielectric characteristics, a ratio of the epoxy resin containing a biphenyl structure in Component (d) is preferably 50% by weight or more, more preferably 70% by weight or more, particularly preferably 100% by weight, i.e., all the Component (d) is the epoxy resin containing a biphenyl structure.

The resin composition of the second embodiment may further contain Component (b), and in such a case, a sum of said Component (b), and Component (b) to be used for formation of the phenol-modified cyanate ester oligomer is preferably within the range of 2 to 60 parts by weight based on 100 parts by weight of Component (a). For example, Component (b) is previously reacted in the range of 0.4 parts by weight or more and less than 60 parts by weight based on 100 parts by weight of Component (a) to prepare a phenol-modified cyanate ester oligomer, and then, Component (b) is additionally formulated so that a sum of the amount thereof with that of Component (b) to be used for formation of the phenol-modified cyanate ester oligomer becomes within the range of 2 to 60 parts by weight. When Component (b) is previously reacted in the range of 2 to 60 parts by weight based on 100 parts by weight of Component (a) to obtain a phenol-modified cyanate ester oligomer, additional Component (b) may not be formulated, or may be formulated so that a sum of the amount thereof with that of Component (b) to be used for formation of the phenol-modified cyanate ester oligomer becomes within the range of 2 to 60 parts by weight. Incidentally, in the above-mentioned case, Component (b) to be used for formation of the phenol-modified cyanate ester oligomer, and additional Component (b) may be the same or different from each other, and each may be used in combination of two or more kinds in admixture.

The phenol-modified cyanate ester oligomer can be prepared by, for example, dissolving Component (a) and Component (b) in a solvent such as toluene, xylene, mesitylene, etc., and heating at 70 to 120° C. for 0.5 to 10 hours. At this time, the metal series catalyst described in the first embodiment may be added. These metal series catalysts are to promote modification by phenol. Incidentally, the phenol-modified cyanate ester oligomer may be made, for example, a conversion of the initial cyanate group of 20 to 70%, preferably within the range of 30 to 65%.

Incidentally, formation of the phenol-modified cyanate ester oligomer is preferably carried out in the presence of Component (c). Component (c) can be made a melting product by heating or a solution in which it is dissolved in a solvent. According to this, it is possible to establish the so-called "semi-IPN" in which a phenol-modified cyanate ester oligomer and Component (c) are uniformly compatibilized. When it is made a solution, as a solvent, there may be mentioned a solvent such as alcohols such as methanol, ethanol, ethylene glycol, ethylene glycol monomethyl ether, etc., ketones such as acetone, methyl ethyl ketone, methyl isobutyl ketone, cyclohexanone, etc., aromatic hydrocarbons such as toluene, xylene, mesitylene, etc., esters such as methoxyethyl acetate, ethoxyethyl acetate, butoxyethyl acetate, ethyl acetate, etc., amides such as N-methylformamide, N,N-dimethylformamide, N,N-dimethylacetamide, N-methylpyrrolidone, etc. In particular, aromatic hydrocarbons such as toluene, xylene, mesitylene, etc. are more preferred.

In the resin composition of the second embodiment, (e) a flame retardant may be formulated similarly as in the resin composition of the first embodiment. With regard to examples of Component (e), and a formulation amount thereof, descriptions with regard to the resin composition of the first embodiment can be applied to. Also, in the resin composition of the second embodiment, (f) an anti-oxidant may be formulated. With regard to examples of Component (f), and a formulation amount thereof, descriptions with regard to the resin composition of the first embodiment can be applied to. In the formulation amounts of the flame retardant and the antioxidant, in the sum of Components (a) to (d), Component (a) and Component (b) which are starting materials of the phenol-modified cyanate ester oligomer are to be contained.

In the resin composition of the second embodiment, a metal series catalyst, a compound having a catalytic function which promotes the reaction of the glycidyl group of an epoxy resin, a filler and the other additives, etc. can be formulated, and with regard to examples thereof, formulation amounts, and the method of producing the resin composition, descriptions with regard to the first embodiment can be applied to. Incidentally, in the formulation amount of the filler, in the sum of Components (a) to (d), Component (a) and Component (b) which are starting materials of the phenol-modified cyanate ester oligomer are to be contained.

The resin composition of the third embodiment is a composition containing an epoxy/phenol-modified cyanate ester oligomer obtained by reacting (a) a cyanate ester compound having 2 or more cyanate groups in the molecule and/or a prepolymer, (b) a monovalent phenol compound and (d) an epoxy resin containing at least one kind of an epoxy resin containing a biphenyl structure, and Component (c).

With regard to examples of Component (a), Component (b) and Component (d) to be used for formation of the epoxy/phenol-modified cyanate ester oligomer, descriptions of Component (a), Component (b) and Component (d) with regard to the first embodiment can be applied to. For formation of the epoxy/phenol-modified cyanate ester oligomer, Component (b) is preferably 2 to 60 parts by weight based on 100 parts by weight of Component (a), more preferably 3 to 45 parts by weight, particularly preferably 4 to 30 parts by weight. Component (d) is preferably 10 to 250 parts by weight based on 100 parts by weight of Component (a), more preferably 10 to 150 parts by weight, particularly preferably 10 to 100 parts by weight. In the point of dielectric characteristics, a ratio of the epoxy resin containing a biphenyl structure in Component (d) is preferably 50% by weight or more, more preferably 70% by weight or more, particularly preferably 100% by weight, i.e., all the Component (d) is the epoxy resin containing a biphenyl structure. With regard to Component (c), descriptions of Component (c) with regard to the first embodiment can be applied to. A formulation amount of Component (c) is preferably 5 to 300 parts by weight based on 100 parts by weight of Component (a) which is used for formation of the epoxy/phenol-modified cyanate ester oligomer, more preferably 10 to 200 parts by weight, particularly preferably 15 to 100 parts by weight.

The epoxy/phenol-modified cyanate ester oligomer may further contain Component (b), and in such a case, a sum of said Component (b), and Component (b) to be used for formation of the epoxy/phenol-modified cyanate ester oligomer is preferably within the range of 2 to 60 parts by weight based on 100 parts by weight of Component (a). For example, 0.4 parts by weight or more and less than 60 parts by weight of Component (b), and 10 to 250 parts by weight of Component (d) are previously reacted based on 100 parts by weight of Component (a) to prepare an epoxy/phenol-modified cyanate ester oligomer, and then, Component (b) is additionally formulated so that a sum of the amount thereof with that of Component (b) to be used for formation of the an epoxy/phenol-modified cyanate ester oligomer becomes within the range of 2 to 60 parts by weight. When 2 to 60 parts by weight of Component (b), and 10 to 250 parts by weight of Component (d) based on 100 parts by weight of Component (a) are provisionally reacted to prepare the epoxy/phenol-modified cyanate ester oligomer, additional Component (b) may not be formulated, or may be formulated so that a sum of the amount thereof with that of Component (b) to be used for formation of the epoxy/phenol-modified cyanate ester oligomer becomes within the range of 2 to 60 parts by weight. Incidentally, in the above-mentioned case, Component (b) to be used for formation of the epoxy/-phenol-modified cyanate ester oligomer, and additional Component (b) may be the same or different from each other, and each may be used in combination of two or more kinds in admixture.

The phenol-modified cyanate ester oligomer can be prepared, for example, Component (a), and Component (b) and Component (d) are mixed in a solvent such as toluene, xylene, mesitylene, etc., and heating to 70 to 120° C. for 0.5 to 10 hours. At this time, the metal series catalyst described in the first embodiment may be added to the mixture. Incidentally, the phenol-modified cyanate ester oligomer can be made, for example, a conversion of the initial cyanate group of 20 to 70%, preferably in the range of 30 to 65%.

Incidentally, formation of the epoxy phenol-modified cyanate ester oligomer is preferably carried out in the presence of Component (c). Epoxy/phenol-modification can be carried out in a melting product of Component (c) under heating, or in a solution dissolved in a solvent. The solvent can be applied to those as mentioned in the second embodiment. According to the above, the so-called "semi-IPN" in which the epoxy/phenol-modified cyanate ester oligomer and Component (c) are uniformly compatibilized can be obtained.

In the resin composition of the third embodiment, (e) a flame retardant can be formulated similarly as in the resin composition of the first embodiment. With regard to examples of Component (e), and a formulation amount thereof, descriptions with regard to the resin composition of the first embodiment can be applied to. Also, in the resin composition of the third embodiment, (f) an antioxidant can be formulated. With regard to examples of Component (f), and a formulation amount thereof, descriptions with regard to the resin composition of the first embodiment can be applied to. In the formulation amounts of the flame retardant and the antioxidant, in the sum of Components (a) to (d), Component (a), Component (b) and Component (d) which are starting materials of the phenol-modified cyanate ester oligomer are to be contained.

In the resin composition of the third embodiment, a metal series catalyst, a compound having a catalytic function which promotes the reaction of the glycidyl group of an epoxy resin, a filler and the other additives, etc. can be formulated, and with regard to examples thereof, formulation amounts, and the method of producing the resin composition, descriptions with regard to the first embodiment can be applied to. Incidentally, in the formulation amount of the filler, in the sum of Components (a) to (d), Component (a), Component (b) and Component (d) which are starting materials of the epoxy/phenol-modified cyanate ester oligomer are to be contained.

By using the resin composition for printed wiring board of the first to the third embodiment according to the present invention, a prepreg for a printed wiring board or a metal clad laminated board can be produced according to the conventionally known method. For example, the resin composition for printed wiring board of the present invention is as such, or in a form of a varnish in which they are dissolved or dispersed in a solvent, impregnated into a substrate such as a glass cloth, etc., and then, drying in a drying oven usually at a temperature of 80 to 200° C. (provided that, when a solvent is used, it is set at a temperature capable of volatilizing the solvent or higher), preferably at 100 to 180° C., for 3 to 30 minutes, preferably 3 to 15 minutes to obtain a prepreg. Then, this prepreg is laminated with a plural number of sheets, a metal foil(s) is/are provided on one surface or both surfaces thereof, and molding under heating to produce a both surface or one surface metal clad laminated board.

Incidentally, the solvent to be used in the above-mentioned varnishing treatment is not specifically limited, and there may be mentioned a solvent, for example, alcohols such as methanol, ethanol, ethylene glycol, ethylene glycol monomethyl ether, etc., ketones such as acetone, methyl ethyl ketone, methyl isobutyl ketone, cyclohexanone, etc., aromatic hydrocarbons such as toluene, xylene, mesitylene, etc., esters such as methoxyethyl acetate, ethoxyethyl acetate, butoxyethyl acetate, ethyl acetate, etc., amides such as N-methylformamide, N,N-dimethylformamide, N,N-dimethylacetamide, N-methylpyrrolidone, etc. In particular, aromatic hydrocarbons such as toluene, xylene, mesitylene, etc. are more preferred. They may be used alone or in combination of two or more kinds. When it is used as a mixed solvent, if the above-mentioned aromatic hydrocarbons and ketones such as acetone, methyl ethyl ketone, methyl isobutyl ketone, cyclohexanone, etc. are used in combination, a viscosity of the varnish can be lowered, so that it is preferred in the point of obtaining a high-concentration varnish. A formulation amount of the ketone series solvents is preferably used in an amount of 30 to 300 parts by weight based on 100 parts by weight of the aromatic hydrocarbon series solvents, more preferably 30 to 250 parts by weight, further preferably 30 to 220 parts by weight.

The resin composition for printed wiring board of the present invention, and the varnish, prepreg and metal clad laminated board using the same can be used for a printed wiring board which can be used for information communication-related devices (parts such as a filter, VCO, etc. included in mobile communication devices, or signal processor, power amplifier and antenna which constitutes wireless base station equipments, or a high speed computer which exceeds a clock frequency of 1 GHz such as a server, router and microprocessor, etc.) which are required to have higher frequencies and high speed in signals.

EXAMPLE

In the following, the present invention is explained in more detail by referring to specific examples, but the present invention is not limited by these.

The first invention of the present invention is explained by referring to the following examples.

Example 1

In a 3-liter four-necked separable flask equipped with a thermometer, a condenser and a stirring device, 833 g of toluene, 1000 g of a prepolymer (Arocy B-10, available from Ciba Geigy AG) of 2,2-bis(4-cyanatophenyl)propane and 547 g of 3,3',5,5'-tetramethylbiphenol diglycidyl ether (a tetramethylbiphenyl type epoxy resin, YX-4000, available from Japan Epoxy Resin Co.) were charged, and the mixture was heated to 80° C. and dissolved under stirring. Then, after confirmation of dissolution, the mixture was cooled to room temperature, 1.25 g of zinc naphthenate (available from Wako Pure Chemical Industries, Ltd.) was formulated in the mixture as a curing accelerator to prepare a resin varnish having a non-volatile concentration of about 65% by weight.

Example 2

In a 3-liter four-necked separable flask equipped with a thermometer, a condenser and a stirring device, 780 g of toluene, 1000 g of a prepolymer (Arocy M-30, available from Ciba Geigy AG) of bis(3,5-dimethyl-4-cyanatophenyl)-methane of 2,2-bis(4-cyanatophenyl)propane and 447 g of a mixed biphenyl type epoxy resin (YL-612H, available from Japan Epoxy Resin Co.) comprising biphenol diglycidyl ether and 3,3',5,5'-tetramethylbiphenol diglycidyl ether were charged, and the mixture was heated to 80° C. and dissolved under stirring. Then, after confirmation of dissolution, the mixture was cooled to room temperature, 1.25 g of zinc naphthenate (available from Wako Pure Chemical Industries, Ltd.) was formulated in the mixture as a curing accelerator to prepare a resin varnish having a non-volatile concentration of about 65% by weight.

Example 3

In a 3-liter four-nekced separable flask equipped with a thermometer, a condenser and a stirring device, 885 g of toluene, 1000 g of α,α'-bis(4-cyanatophenyl)-m-diisopropylbenzene (RTX-366, available from Ciba Geigy AG), and 586 g of a biphenyl aralkylene novolac type epoxy resin (NC-3000S-H, available from Nippon Kayaku Co., Ltd.) were charged, and the mixture was heated to 80° C. and dissolved under stirring. Then, after confirmation of dissolution, the mixture was cooled to room temperature, 62 g of p-tert-octylphenol (available from Wako Pure Chemical Industries, Ltd.) and 0.4 g of zinc naphthenate (available from Wako Pure Chemical Industries, Ltd.) as a curing accelerator were formulated in the mixture to prepare a resin varnish having a non-volatile concentration of about 65% by weight.

Example 4

In a 3-liter four-nekced separable flask equipped with a thermometer, a condenser and a stirring device, 438 g of toluene, 1000 g of 2,2-bis(4-cyanatophenyl)propane (Arocy B-10, available from Ciba Geigy AG) and 30 g of p-(α-cumyl)phenol (available from Tokyo Kasei Kogyo Co., Ltd.) were charged, and after confirmation of dissolution and the liquid temperature was maintained at 110° C., 0.3 g of manganese naphthenate (available from Wako Pure Chemical Industries, Ltd.) was formulated in the mixture as a reaction promoter, and the mixture was reacted under heating for about 1 hour to synthesize a phenol-modified cyanate oligomer solution. Then, the reaction solution was cooled, and when the inner temperature reached to 80° C., 457 g of methyl ethyl ketone and 547 g of 3,3',5,5'-tetra-methylbiphenol diglycidyl ether (YX-4000, available from Japan Epoxy Resin Co.) were formulated in the mixture under stirring. After confirmation of the dissolution, the mixture was cooled to room temperature, and 92 g of p-α-cumyl)phenol and 0.15 g of zinc naphthenate (available from Wako Pure Chemical Industries, Ltd.) as a curing accelerator were formulated in the mixture to prepare a resin varnish having a non-volatile concentration of about 65% by weight.

Example 5

In the same manner as in Example 4 except for using a biphenyl aralkylene novolac type epoxy resin (NC-3000S-H, available from Nippon Kayaku Co., Ltd.) in place of 3,3',5, 5'-tetramethylbiphenol diglycidyl ether (YX-4000, available from Japan Epoxy Resin Co.) and formulating in a formulation amount as shown in Table 1, the procedure was carried out as in Example 4 to prepare a resin varnish.

Comparative Example 1

In the same manner as in Example 1 except for using a bisphenol A type epoxy resin (DER-331L, available from Dow Chemical) in place of 3,3',5,5'-tetramethylbiphenol diglycidyl ether and formulating in a formulation amount as shown in Table 1, the procedure was carried out as in Example 1 to prepare a resin varnish having a non-volatile concentration of about 65% by weight.

Comparative Example 2

In the same manner as in Example 1 except for using a phenol novolac type epoxy resin (N-770, available from Dainippon Ink and Chemicals Incorporated) in place of 3,3', 5,5'-tetramethylbiphenol diglycidyl ether and formulating in a formulation amount as shown in Table 1, the procedure was carried out as in Example 1 to prepare a resin varnish having a non-volatile concentration of about 65% by weight.

Comparative Example 3

In the same manner as in Example 1 except for using a bisphenol A novolac type epoxy resin (N-865, available from Dainippon Ink and Chemicals Incorporated) in place of 3,3', 5,5'-tetramethylbiphenol diglycidyl ether and formulating in a formulation amount as shown in Table 1, the procedure was carried out as in Example 1 to prepare a resin varnish having a non-volatile concentration of about 65% by weight.

Comparative Example 4

In the same manner as in Example 1 except for using a methyl group and tert-butyl group-substitution type phenol salicylic aldehyde novolac type epoxy resin (TMH-574, available from Sumitomo Chemical Co., Ltd.) in place of 3,3',5,5'-tetramethylbiphenol diglycidyl ether and formulating in a formulation amount as shown in Table 1, the procedure was carried out as in Example 1 to prepare a resin varnish having a non-volatile concentration of about 65% by weight.

Comparative Example 5

In the same manner as in Example 1 except for using a dicyclopentadiene skeleton-containing epoxy resin (HP-7200, available from Dainippon Ink and Chemicals Incorporated) in place of 3,3',5,5'-tetramethylbiphenol diglycidyl ether and formulating in a formulation amount as shown in Table 1, the procedure was carried out as in Example 1 to prepare a resin varnish having a non-volatile concentration of about 65% by weight.

Comparative Example 6

In the same manner as in Example 1 except for using, a β-naphtholaralkylene type epoxy resin (ESN-175, available from Nippon Steel Chemical Group) in place of 3,3',5,5'-tetramethylbiphenol diglycidyl ether and formulating in a formulation amount as shown in Table 1, the procedure was carried out as in Example 1 to prepare a resin varnish having a non-volatile concentration of about 65% by weight.

TABLE 1

| | Item | Example 1 | Example 2 | Example 3 | Example 4 | Example 5 | Comparative example 1 | Comparative example 2 | Comparative example 3 | Comparative example 4 | Comparative example 5 | Comparative example 6 |
|---|---|---|---|---|---|---|---|---|---|---|---|---|
| Cyanate ester compound | Arocy B-30 | 1000 | — | — | — | — | 1000 | 1000 | 1000 | 1000 | 1000 | 1000 |
| | Arocy M-30 | — | 1000 | — | — | — | — | — | — | — | — | — |
| | RTX-366 | — | — | 1000 | — | — | — | — | — | — | — | — |
| | Arocy B-10 | — | — | — | 1000 | 1000 | — | — | — | — | — | — |
| Phenol compound | p-tert-octyl phenol | — | — | 62 | — | — | — | — | — | — | — | — |
| | p-(α-cumyl) phenol | — | — | — | 30 92 | 30 92 | — | — | — | — | — | — |
| Epoxy resin | YX-4000 | 547 | — | — | 547 | — | — | — | — | — | — | — |
| | YL-6121H | — | 447 | — | — | — | — | — | — | — | — | — |
| | NC-3000S-H | — | — | 586 | — | 834 | — | — | — | — | — | — |
| | DER-331L | — | — | — | — | — | 532 | — | — | — | — | — |
| | N-770 | — | — | — | — | — | — | 544 | — | — | — | — |
| | N-865 | — | — | — | — | — | — | — | 540 | — | — | — |
| | TMH-574 | — | — | — | — | — | — | — | — | 622 | — | — |
| | HP-7200 | — | — | — | — | — | — | — | — | — | 735 | — |
| | ESN-175 | — | — | — | — | — | — | — | — | — | — | 700 |
| Curing accelerator (Reaction catalyst) | Manganese naphthenate | — | — | — | 0.3 | 0.3 | — | — | — | — | — | — |
| | Zinc naphthenate | 1.25 | 1.25 | 0.4 | 0.15 | 0.15 | 1.25 | 1.25 | 1.25 | 1.25 | 1.25 | 1.25 |
| Non-volatile concentration of varnish (% by weight) | | 65 | 65 | 65 | 65 | 65 | 65 | 65 | 65 | 65 | 65 | 65 |

The resin varnishes obtained in Examples 1 to 5 and Comparative examples 1 to 6 were each impregnated into a glass cloth (E glass) with a thickness of 0.15 mm, and then, the material was dried at 160° C. for 5 to 15 minutes to obtain the respective prepregs with a resin solid content of 52% by weight. Then, four sheets of this prepregs were laminated, and copper foils with a thickness of each 18 μm were provided on the both outermost layers, and molding was carried out under the pressing conditions of 230° C. for 70 minutes and 2.5 MPa by heating and pressure to prepare a both-surface copper clad laminated board. With regard to the obtained copper clad laminated board, dielectric characteristics, copper foil peeling strength, solder heat resistance, water absorption rate, bending characteristics, thermal expansion coefficient (α) and Tg (glass transition temperature) were evaluated. The evaluation results are shown in Table 2.

Evaluation methods of the characteristics of the copper clad laminated boards are as shown below.

Dielectric constant ($\varepsilon$r) and dielectric dissipation factor (tan δ) of the copper clad laminated boards were measured by a triplate line resonator method using a vector type network analyzer. Incidentally, the measurement consitions are made a frequency: 1 GHz, measurement temperatures: room temperature (25° C.) and 90° C.

Thermal expansion coefficient (α) and Tg of the copper clad laminated boards (whole surface-copper foil etched product) were measured by TMA.

Copper foil peeling strength of the copper clad laminated boards was measured according to the copper clad laminated boards test standard JIS-C-6481.

Solder heat resistance of the copper clad laminated boards (whole surface-copper foil etched product) was examined by maintaining in a pressure cooker tester (conditions: 121° C., 2.2 atm) for 1 to 5 hours, then, immersing in a melting solder at 260° C. and 288° C. for 20 seconds, and the appearance thereof was judged with naked eyes. No abnormality in the table means that there is no occurrence of measling or blister.

Water absorption rate of the copper clad laminated boards (whole surface-copper foil etched product) was calculated from a weight difference between the normal state and after maintaining in a pressure cooker tester (conditions: 121° C., 2.2 atm) for 5 hours (unit: % by weight).

Bending characteristics of the copper clad laminated boards (whole surface-copper foil etched product) were obtained by measuring bending modulus at room temperature and at 200° C. according to copper clad laminated boards test standard JIS-C-6481, breaking strength and breaking elongation at room temperature, and yield strength and yield elongation at 200° C.

TABLE 2

| Item | | Example 1 | Example 2 | Example 3 | Example 4 | Example 5 |
|---|---|---|---|---|---|---|
| Copper foil peeling strength (kN/m) | | 1.5 | 1.5 | 1.5 | 1.5 | 1.5 |
| $\varepsilon$r | 1 GHz (25° C.) | 3.62 | 3.55 | 3.45 | 3.58 | 3.62 |
| | 1 GHz (90° C.) | 3.64 | 3.52 | 3.47 | 3.60 | 3.65 |
| tan δ | 1 GHz (25° C.) | 0.0064 | 0.0062 | 0.0045 | 0.0059 | 0.0062 |
| | 1 GHz (90° C.) | 0.0069 | 0.0067 | 0.0051 | 0.0064 | 0.0067 |
| Solder heat resistance | PCT 1 h | 3/3 | 3/3 | 3/3 | 3/3 | 3/3 |
| (260° C.) | PCT 2 h | 3/3 | 3/3 | 3/3 | 3/3 | 3/3 |
| (Number of no abnormality/ | PCT 3 h | 3/3 | 3/3 | 3/3 | 3/3 | 3/3 |
| Number of tested) | PCT 4 h | 3/3 | 3/3 | 3/3 | 3/3 | 3/3 |
| | PCT 5 h | 3/3 | 3/3 | 3/3 | 3/3 | 3/3 |

TABLE 2-continued

| | | | | | | |
|---|---|---|---|---|---|---|
| (288° C.) | PCT 1 h | 3/3 | 3/3 | 3/3 | 3/3 | 3/3 |
| | PCT 2 h | 3/3 | 3/3 | 3/3 | 3/3 | 3/3 |
| | PCT 3 h | 3/3 | 3/3 | 3/3 | 3/3 | 3/3 |
| | PCT 4 h | 1/3 | 1/3 | 3/3 | 2/3 | 1/3 |
| | PCT 5 h | 1/3 | 0/3 | 3/3 | 1/3 | 1/3 |
| Water absorption rate (% by weight) | PCT 5 h | 0.53 | 0.53 | 0.51 | 0.51 | 0.51 |
| TMA | Tg(° C.) | 195 | 190 | 179 | 191 | 188 |
| | α(ppm/° C., <Tg) | 50 | 51 | 53 | 50 | 51 |
| | α(ppm/° C., >Tg) | 298 | 291 | 290 | 289 | 298 |
| Bending modulus(GPa) | Room temperature: 25° C. | 19 | 19 | 18 | 19 | 18 |
| | 200° C. | 12 | 12 | 9 | 12 | 9 |
| Breaking strength(MPa) (Yield strength) | Room temperature: 25° C. (200° C.) | 602 (255) | 589 (231) | 579 (200) | 612 (243) | 577 (203) |
| Breaking elongation(%) (Yield strength) | Room temperature: 25° C. (200° C.) | 3.8 (3.9) | 3.7 (3.7) | 3.8 (3.8) | 3.8 (3.8) | 3.7 (3.7) |

| | | Comparative example | | | | | |
|---|---|---|---|---|---|---|---|
| Item | | 1 | 2 | 3 | 4 | 5 | 6 |
| Copper foil peeling strength (kN/m) | | 1.5 | 1.5 | 1.5 | 1.5 | 1.4 | 1.5 |
| εr | 1 GHz (25° C.) | 3.67 | 3.68 | 3.66 | 3.64 | 3.65 | 3.64 |
| | 1 GHz (90° C.) | 3.74 | 3.74 | 3.75 | 3.70 | 3.70 | 3.70 |
| tanδ | 1 GHz (25° C.) | 0.0082 | 0.0085 | 0.0088 | 0.0067 | 0.0069 | 0.0068 |
| | 1 GHz (90° C.) | 0.0101 | 0.0105 | 0.0108 | 0.0079 | 0.0081 | 0.0080 |
| Solder heat resistance (260° C.) (Number of no abnormality/ Number of tested) | PCT 1 h | 3/3 | 3/3 | 3/3 | 3/3 | 3/3 | 3/3 |
| | PCT 2 h | 3/3 | 3/3 | 3/3 | 3/3 | 3/3 | 3/3 |
| | PCT 3 h | 2/3 | 3/3 | 3/3 | 3/3 | 3/3 | 3/3 |
| | PCT 4 h | 1/3 | 3/3 | 3/3 | 3/3 | 1/3 | 3/3 |
| | PCT 5 h | 0/3 | 2/3 | 3/3 | 3/3 | 0/3 | 3/3 |
| (288° C.) | PCT 1 h | 3/3 | 3/3 | 3/3 | 3/3 | 3/3 | 3/3 |
| | PCT 2 h | 3/3 | 3/3 | 3/3 | 3/3 | 3/3 | 3/3 |
| | PCT 3 h | 1/3 | 1/3 | 1/3 | 2/3 | 0/3 | 1/3 |
| | PCT 4 h | 0/3 | 0/3 | 0/3 | 0/3 | 0/3 | 0/3 |
| | PCT 5 h | 0/3 | 0/3 | 0/3 | 0/3 | 0/3 | 0/3 |
| Water absorption rate (% by weight) | PCT 5 h | 0.54 | 0.58 | 0.58 | 0.55 | 0.55 | 0.54 |
| TMA | Tg(° C.) | 179 | 192 | 194 | 201 | 189 | 192 |
| | α(ppm/° C., <Tg) | 54 | 53 | 53 | 59 | 57 | 57 |
| | α(ppm/° C., >Tg) | 379 | 321 | 343 | 302 | 322 | 335 |
| Bending modulus(GPa) | Room temperature: 25° C. | 19 | 19 | 19 | 19 | 18 | 19 |
| | 200° C. | 8 | 13 | 14 | 14 | 9 | 13 |
| Breaking strength(MPa) (Yield strength) | Room temperature: 25° C. (200° C.) | 542 (134) | 502 (245) | 502 (231) | 511 (285) | 532 (188) | 542 (254) |
| Breaking elongationÜ%) (Yield strength) | Room temperature: 25° C. (200° C.) | 3.4 (3.3) | 3.2 (2.3) | 3.1 (2.3) | 3.2 (2.2) | 3.5 (3.5) | 3.3 (2.5) |

As can be clearly seen from Table 2, the laminated boards prepared by using varnishes of Examples 1 to 5 are excellent in dielectric characteristics (in particular, dielectric dissipation factor) at room temperature (25° C.) and 1 GHz than those of the laminated boards of Comparative examples 1 to 6, in particular, dielectric characteristics of the laminated boards of Examples 3 and 4 in which a monovalent phenol compound was used in combination gave more excellent results. Moreover, dielectric characteristics (in particular, dielectric dissipation factor) of each Example at 90° C. are also good, and dependency on temperature change is little. Also, the laminated boards of Examples give better results in solder heat resistance (in particular, at 288° C.) under humid conditions as compared to the laminated boards of Comparative examples. Moreover, the laminated boards of Examples give higher values in breaking strength and breaking elongation at room temperature (25° C.) and yield elongation at high temperature (200° C.) than those of the laminated boards of Comparative examples.

The second invention of the present invention is explained by referring to the following examples.

Examples 6 to 10, Comparative Examples 7 to 12

Resin varnishes for metal clad laminated boards were produced according to the formulation amounts as shown in Table 3.

Example 6

In a 3-liter four-nekced separable flask equipped with a thermometer, a condenser and a stirring device, 300 g of toluene and 175 g of polyphenylene ether resin (PKN4752, available from GE Japan Co.) were charged, and the mixture was heated to 90° C. and dissolved under stirring. Next, 500 g of 2,2-bis(4-cyanatophenyl)propane (Arocy B-10, available from Ciba Geigy AG) and 32 g of p-tert-butylphenol (available from Kanto Kagaku) were charged therein, after confirmation of dissolution and the liquid temperature was maintained at 110° C., 0.13 g of zinc naphthenate (available from Wako Pure Chemical Industries, Ltd.) as a reaction promoter was formulated in the mixture, and the mixture was reacted for about 3 hours to synthesize a phenol-modified cyanate ester oligomer solution which is compatibilized with a polyphenylene ether resin. Then, the reaction solution was cooled, and when the inner temperature reached to 80° C., 530 g of methyl ethyl ketone and 308 g of 3,3',5,5'-tetramethylbiphenol diglycidyl ether (a tetramethylbiphenyl type epoxy resin, YX-4000, available from Japan Epoxy Resin Co.) were formulated in the mixture under stirring. Then, after confirmation of dissolution, the mixture was cooled to room temperature, 0.1 g of zinc naphthenate was formulated in the mixture as a curing accelerator to prepare a resin varnish having a non-volatile concentration of about 55% by weight.

Example 7

In a 3-liter four-nekced separable flask equipped with a thermometer, a condenser and a stirring device, 275 g of toluene and 100 g of polyphenylene ether resin (PKN4752, available from GE Japan Co.) were charged, and the mixture was heated to 90° C. and dissolved under stirring. Next, 500 g of bis(3,5-dimethyl-4-cyanatophenyl)methane (Arocy M-10, available from Ciba Geigy AG) and 47 g of p-tert-octylphenol (available from Wako Pure Chemical Industries, Ltd.) were charged, after confirmation of dissolution and the liquid temperature was maintained at 110° C., 0.25 g of cobalt naphthenate (available from Wako Pure Chemical Industries, Ltd.) as a reaction promoter was formulated in the mixture, and the mixture was reacted for about 3 hours to synthesize a phenol-modified cyanate ester oligomer solution which is compatibilized with a polyphenylene ether resin. Then, the reaction solution was cooled, and when the inner temperature reached to 80° C., 480 g of methyl ethyl ketone and 280 g of a mixed biphenyl type epoxy resin (YL-612H, available from Japan Epoxy Resin Co.) comprising a biphenol diglycidyl ether and of 3,3',5,5'-tetramethylbiphenol diglycidyl ether were formulated in the mixture under stirring. Then, after confirmation of dissolution, the mixture was cooled to room temperature, 0.1 g of zinc naphthenate (available from Wako Pure Chemical Industries, Ltd.) was formulated in the mixture as a curing accelerator to prepare a resin varnish having a non-volatile concentration of about 55% by weight.

Example 8

In a 3-liter four-nekced separable flask equipped with a thermometer, a condenser and a stirring device, 285 g of toluene and 150 g of polyphenylene ether resin (PKN4752, available from GE Japan Co.) were charged, and the mixture was heated to 90° C. and dissolved under stirring. Next, 500 g of 2,2-bis(4-cyanatophenyl)propane (Arocy B-10, available from Ciba Geigy AG) and 15 g of p-($\alpha$-cumyl)phenol (available from Tokyo Kasei Kogyo Co., Ltd.) were charged, after confirmation of dissolution and the liquid temperature was maintained at 110° C., 0.16 g of manganese naphthenate (available from Wako Pure Chemical Industries, Ltd.) as a reaction promoter was formulated in the mixture, and the mixture was reacted for about 3 hours to synthesize a phenol-modified cyanate ester oligomer solution which is compatibilized with a polyphenylene ether resin. Then, the reaction solution was cooled, and when the inner temperature reached to 80° C., 520 g of methyl ethyl ketone and 273 g of 3,3',5,5'-tetramethylbiphenol diglycidyl ether (YX-4000, available from Japan Epoxy Resin Co.) were formulated in the mixture under stirring. Then, after confirmation of dissolution and the mixture was cooled to room temperature, 46 g of p-($\alpha$-cumyl) phenol and 0.1 g of zinc naphthenate (available from Wako Pure Chemical Industries, Ltd.) was formulated in the mixture as a curing accelerator to prepare a resin varnish having a non-volatile concentration of about 55% by weight.

Example 9

In a 3-liter four-nekced separable flask equipped with a thermometer, a condenser and a stirring device, 270 g of toluene and 180 g of polyphenylene ether resin (PKN4752, available from GE Japan Co.) were charged, and the mixture was heated to 90° C. and dissolved under stirring. Next, 450 g of $\alpha,\alpha'$-bis(4-cyanatophenyl)-m-diisopropylbenzene (RTX-366, available from Ciba Geigy AG) and 4 g of p-tert-amylphenol (available from Tokyo Kasei Kogyo Co., Ltd.) were charged, after confirmation of dissolution and the liquid temperature was maintained at 110° C., 0.14 g of iron naphthenate (available from Kanto Kagaku) was formulated in the mixture as a reaction promoter, and the mixture was reacted for about 3 hours to synthesize a phenol-modified cyanate ester oligomer solution which is compatibilized with a polyphenylene ether resin. Then, the reaction solution was cooled, and when the inner temperature reached to 80° C., 535 g of methyl ethyl ketone and 330 g of a biphenyl aralkylene novolac type epoxy resin (NC-3000S-H, available from Nippon Kayaku Co., Ltd.) were formulated in the mixture under stirring. Then, after confirmation of dissolution, the mixture was cooled to room temperature, 23 g of p-tert-octylphenol (available from Wako Pure Chemical Industries, Ltd.) and 0.1 g of zinc naphthenate (available from Wako Pure Chemical Industries, Ltd.) was formulated in the mixture as a curing accelerator to prepare a resin varnish having a non-volatile concentration of about 55% by weight.

Example 10

In a 3-liter four-nekced separable flask equipped with a thermometer, a condenser and a stirring device, 290 g of toluene and 225 g of polyphenylene ether resin (PKN4752, available from GE Japan Co.) were charged, and the mixture was heated to 90° C. and dissolved under stirring. Next, 450 g of a phenol novolac type cyanate ester resin (REX-371, available from Ciba Geigy AG) and 13 g of p-($\alpha$-cumyl) phenol (available from Tokyo Kasei Kogyo Co., Ltd.) were charged, after confirmation of dissolution and the liquid temperature was maintained at 110° C., 0.15 g of manganese naphthenate (available from Wako Pure Chemical Industries, Ltd.) was formulated in the mixture as a reaction promoter, and the mixture was reacted for about 2 hours under heating to synthesize a phenol-modified cyanate ester oligomer solution which is compatibilized with a polyphenylene ether resin. Then, the reaction solution was cooled, and when the inner temperature reached to 80° C., 500 g of methyl ethyl ketone, 148 g of 3,3',5,5'-tetramethyl-biphenol diglycidyl ether (YX-4000, available from Japan Epoxy Resin Co.) and 90 g of a cresol novolac type epoxy resin (ESCN-190-3, available from Sumitomo Chemical Co., Ltd.) were formulated in the mixture under stirring. Then, after confirmation of dissolution and the mixture was cooled to room temperature, 45 g of p-tert-octylphenol (available from Wako Pure Chemical Industries, Ltd.) and 0.1 g of zinc naphthenate (available from Wako Pure Chemical Industries, Ltd.) as a curing accelerator was formulated in the mixture to prepare a resin varnish having a non-volatile concentration of about 55% by weight.

Comparative Example 7

In the same manner as in Example 6 except for removing 3,3',5,5'-tetramethylbiphenol diglycidyl ether (YX-4000), and methyl ethyl ketone was so formulated in a formulation amount that a non-volatile concentration became about 55% by weight, the procedure was carried out as in Example 6 to prepare a resin varnish having the non-volatile concentration of about 55% by weight.

Comparative Example 8

In the same manner as in Example 6 except for formulating a bisphenol A type epoxy resin (DER-331L, available from Dow Chemical) in place of 3,3',5,5'-tetramethylbiphenol diglycidyl ether with a formulation amount as shown in Table 3, and methyl ethyl ketone was so formulated in a formulation amount that a non-volatile concentration became about 55% by weight, the procedure was carried out as in Example 6 to prepare a resin varnish having the non-volatile concentration of about 55% by weight.

Comparative Example 9

In the same manner as in Example 6 except for formulating p-tert-amylphenol (available from Tokyo Kasei Kogyo Co., Ltd.) in place of p-tert-butylphenol, and a phenol novolac type epoxy resin (N-770, available from Dainippon Ink and Chemicals Incorporated) in place of 3,3',5,5'-tetramethylbiphenol diglycidyl ether with formulation amounts as shown in Table 3, respectively, and methyl ethyl ketone was so formulated in a formulation amount that a non-volatile concentration became about 55% by weight, the procedure was carried out as in Example 6 to prepare a resin varnish having the non-volatile concentration of about 55% by weight.

Comparative Example 10

In the same manner as in Example 7 except for formulating a bisphenol A novolac type epoxy resin (N-865, available from Dainippon Ink and Chemicals Incorporated) in place of a mixed biphenyl type epoxy resin (YL-612H) comprising biphenol diglycidyl ether and 3,3',5,5'-tetramethylbiphenol diglycidyl ether, and zinc naphthenate (available from Wako Pure Chemical Industries, Ltd.) in place of cobalt naphthenate (available from Wako Pure Chemical Industries, Ltd.) with formulation amounts as shown in Table 3, respectively, and methyl ethyl ketone was so formulated in a formulation amount that a non-volatile concentration became about 55% by weight, the procedure was carried out as in Example 7 to prepare a resin varnish having the non-volatile concentration of about 55% by weight.

Comparative Example 11

In the same manner as in Example 6 except for formulating p-tert-octylphenol (available from Wako Pure Chemical Industries, Ltd.) in place of p-tert-butylphenol, and a phenol salicylic aldehyde novolac type epoxy resin (EPPN-502H, available from Nippon Kayaku Co., Ltd.) in place of 3,3',5, 5'-tetramethylbiphenol diglycidyl ether with formulation amounts as shown in Table 3, respectively, and methyl ethyl ketone was so formulated in a formulation amount that a non-volatile concentration became about 55% by weight, the procedure was carried out as in Example 6 to prepare a resin varnish having the non-volatile concentration of about 55% by weight.

Comparative Example 12

In the same manner as in Example 10 except for formulating p-(α-cumyl)phenol (available from Tokyo Kasei Kogyo Co., Ltd.) in place of p-tert-butylphenol, and a dicyclopentadiene skeleton-containing epoxy resin (HP-7200, available from Dainippon Ink and Chemicals Incorporated) in place of a bisphenol A novolac type epoxy resin (N-685) with formulation amounts as shown in Table 3, respectively, and methyl ethyl ketone was so formulated in a formulation amount that a non-volatile concentration became about 55% by weight, the procedure was carried out as in Example 10 to prepare a resin varnish having the non-volatile concentration of about 55% by weight.

TABLE 3

| | Item | Example | | | | | Comparative example | | | | | |
|---|---|---|---|---|---|---|---|---|---|---|---|---|
| | | 6 | 7 | 8 | 9 | 10 | 7 | 8 | 9 | 10 | 11 | 12 |
| Cyanate ester compound | Arocy B-10 | 500 | — | 500 | — | — | 500 | 500 | 500 | — | 500 | — |
| | Arocy M-10 | — | 500 | — | — | — | — | — | — | 500 | — | 500 |
| | RTX-366 | — | — | — | 450 | — | — | — | — | — | — | — |
| | REX-371 | — | — | — | — | 450 | — | — | — | — | — | — |
| Phenol compound | p-tert-butylphenol | 32 | — | — | — | — | 32 | 32 | — | — | — | — |
| | p-tert-octyl phenol | — | 47 | — | 23 | 45 | — | — | — | 47 | 44 | — |
| | p-(α-cumyl) phenol | — | — | 15 / 46 | — | 13 | — | — | — | — | — | 48 |
| | p-tert-amylphenol | — | — | — | 4 | — | — | — | 12 | — | — | — |
| Polyphenylene ether resin | | 175 | 100 | 150 | 180 | 225 | 175 | 175 | 175 | 100 | 175 | 100 |
| Epoxy resin | YX-4000 | 308 | — | 273 | — | 148 | — | — | — | — | — | — |
| | YL-6121H | — | 280 | — | — | — | — | — | — | — | — | — |
| | NC-3000S-H | — | — | — | 330 | — | — | — | — | — | — | — |
| | ESCN-190-3 | — | — | — | — | 90 | — | — | — | — | — | — |
| | DER-331L | — | — | — | — | — | — | 300 | — | — | — | — |
| | N-770 | — | — | — | — | — | — | — | 306 | — | — | — |
| | N-865 | — | — | — | — | — | — | — | — | 338 | — | — |
| | EPPN-502H | — | — | — | — | — | — | — | — | — | 313 | — |
| | HP-7200 | — | — | — | — | — | — | — | — | — | — | 460 |

TABLE 3-continued

|  | | Example | | | | | Comparative example | | | | | |
| --- | --- | --- | --- | --- | --- | --- | --- | --- | --- | --- | --- | --- |
| Item | | 6 | 7 | 8 | 9 | 10 | 7 | 8 | 9 | 10 | 11 | 12 |
| Reaction catalyst (Curing accelerator) | Manganese naphthenate | — | — | 0.16 | — | 0.15 | — | — | — | — | — | — |
| | Cobalt naphthenate | — | 0.25 | — | — | — | — | — | — | — | — | — |
| | Iron naphthenate | — | — | — | 0.14 | — | — | — | — | — | — | — |
| | Zinc naphthenate | 0.13 0.1 | 0.1 | 0.1 | 0.1 | 0.1 | 0.13 0.1 | 0.13 0.1 | 0.13 0.1 | 0.13 0.1 | 0.13 0.1 | 0.13 0.1 |
| Non-volatile concentration of varnish (% by weight) | | 55 | 55 | 55 | 55 | 55 | 55 | 55 | 55 | 55 | 55 | 55 |

Resin varnishes obtained in Examples 6 to 10 and Comparative examples 7 to 12 were each impregnated into a glass cloth (E glass) with a thickness of 0.15 mm, and then, the material was dried at 160° C. for 4 to 7 minutes to obtain the respective prepregs with a resin solid content of 52% by weight. Then, four sheets of this prepregs were laminated, anc copper foils with a thickness of each 18 μm were provided on the both outermost layers, and molding was carried out under the pressing conditions of 230° C. for 70 minutes and 2.5 MPa to prepare a both-surface copper clad laminated board. With regard to the obtained copper clad laminated board, dielectric characteristics, copper foil peeling strength, solder heat resistance, water absorption rate, bending characteristics, thermal expansion coefficient (α) and Tg (glass transition temperature) were evaluated. The evaluation results are shown in Table 4.

Evaluating methods of characteristics of the copper clad laminated boards are as mentioned above.

TABLE 4

| | | Example | | | | |
| --- | --- | --- | --- | --- | --- | --- |
| Item | | 6 | 7 | 8 | 9 | 10 |
| Copper foil peeling strength (kN/m) | | 1.5 | 1.5 | 1.5 | 1.5 | 1.5 |
| εr | 1 GHz (25° C.) | 3.50 | 3.45 | 3.50 | 3.40 | 3.57 |
| | 1 GHz (90° C.) | 3.52 | 3.46 | 3.51 | 3.42 | 3.58 |
| tanδ | 1 GHz (25° C.) | 0.0052 | 0.0046 | 0.0052 | 0.0040 | 0.0054 |
| | 1 GHz (90° C.) | 0.0057 | 0.0051 | 0.0057 | 0.0045 | 0.0058 |
| Solder heat resistance (260° C.) (Number of no abnormality/ Number of tested) (288° C.) | PCT 1 h | 3/3 | 3/3 | 3/3 | 3/3 | 3/3 |
| | PCT 2 h | 3/3 | 3/3 | 3/3 | 3/3 | 3/3 |
| | PCT 3 h | 3/3 | 3/3 | 3/3 | 3/3 | 3/3 |
| | PCT 4 h | 3/3 | 3/3 | 3/3 | 3/3 | 3/3 |
| | PCT 5 h | 3/3 | 3/3 | 3/3 | 3/3 | 3/3 |
| | PCT 1 h | 3/3 | 3/3 | 3/3 | 3/3 | 3/3 |
| | PCT 2 h | 3/3 | 3/3 | 3/3 | 3/3 | 3/3 |
| | PCT 3 h | 3/3 | 3/3 | 3/3 | 3/3 | 3/3 |
| | PCT 4 h | 1/3 | 2/3 | 2/3 | 3/3 | 2/3 |
| | PCT 5 h | 1/3 | 0/3 | 1/3 | 3/3 | 1/3 |
| Water absorption rate (% by weight) | PCT 5 h | 0.52 | 0.50 | 0.51 | 0.47 | 0.53 |
| TMA | Tg (° C.) | 186 | 184 | 185 | 178 | 192 |
| | α (ppm/° C., <Tg) | 50 | 52 | 48 | 53 | 52 |
| | α (ppm/° C., >Tg) | 305 | 294 | 312 | 287 | 296 |
| Bending modulus(GPa) | Room temperature: 25° C. | 18 | 18 | 18 | 17 | 19 |
| | 200° C. | 10 | 10 | 10 | 9 | 13 |
| Breaking strength(MPa) (Yield strength) | Room temperature: 25° C. | 595 | 588 | 605 | 584 | 612 |
| | (200° C.) | (245) | (225) | (230) | (198) | (273) |
| Breaking elongation(%) (Yield strength) | Room temperature: 25° C. | 3.8 | 3.7 | 3.8 | 3.8 | 3.7 |
| | (200° C.) | (3.9) | (3.7) | (3.8) | (3.8) | (3.6) |

| | | Comparative example | | | | | |
| --- | --- | --- | --- | --- | --- | --- | --- |
| Item | | 7 | 8 | 9 | 10 | 11 | 12 |
| Copper foil peeling strength (kN/m) | | 1.5 | 1.5 | 1.4 | 1.4 | 1.4 | 1.4 |
| εr | 1 GHz (25° C.) | 3.50 | 3.60 | 3.63 | 3.52 | 3.60 | 3.50 |
| | 1 GHz (90° C.) | 3.51 | 3.65 | 3.69 | 3.59 | 3.66 | 3.58 |
| Tanδ | 1 GHz (25° C.) | 0.0050 | 0.0062 | 0.0067 | 0.0065 | 0.0066 | 0.0054 |
| | 1 GHz (90° C.) | 0.0053 | 0.0083 | 0.0085 | 0.0082 | 0.0080 | 0.0066 |
| Solder heat resistance (260° C.) (Number of no abnormality/ Number of tested) (288° C.) | PCT 1 h | 3/3 | 3/3 | 3/3 | 3/3 | 3/3 | 3/3 |
| | PCT 2 h | 3/3 | 3/3 | 3/3 | 3/3 | 3/3 | 3/3 |
| | PCT 3 h | 2/3 | 2/3 | 3/3 | 3/3 | 3/3 | 3/3 |
| | PCT 4 h | 1/3 | 1/3 | 3/3 | 3/3 | 3/3 | 1/3 |
| | PCT 5 h | 0/3 | 1/3 | 3/3 | 3/3 | 2/3 | 1/3 |
| | PCT 1 h | 3/3 | 3/3 | 3/3 | 3/3 | 3/3 | 3/3 |
| | PCT 2 h | 2/3 | 3/3 | 3/3 | 3/3 | 3/3 | 3/3 |

TABLE 4-continued

|  |  |  |  |  |  |  |  |
|---|---|---|---|---|---|---|---|
|  | PCT 3 h | 0/3 | 1/3 | 2/3 | 2/3 | 1/3 | 0/3 |
|  | PCT 4 h | 0/3 | 0/3 | 0/3 | 0/3 | 0/3 | 0/3 |
|  | PCT 5 h | 0/3 | 0/3 | 0/3 | 0/3 | 0/3 | 0/3 |
| Water absorption rate (% by weight) | PCT 5 h | 0.50 | 0.54 | 0.58 | 0.58 | 0.62 | 0.53 |
| TMA | Tg (° C.) | 185 | 175 | 188 | 191 | 191 | 185 |
|  | α (ppm/° C., <Tg) | 50 | 55 | 51 | 51 | 63 | 59 |
|  | α (ppm/° C., >Tg) | 285 | 377 | 322 | 328 | 278 | 350 |
| Bending modulus(GPa) | Room temperature: 25° C. | 18 | 18 | 18 | 18 | 18 | 18 |
|  | 200° C. | 11 | 7 | 12 | 13 | 13 | 9 |
| Breaking strength(MPa) (Yield strength) | Room temperature: 25° C. | 488 | 558 | 516 | 502 | 512 | 535 |
|  | (200° C.) | (210) | (142) | (244) | (232) | (286) | (189) |
| Breaking elongation(%) (Yield strength) | Room temperature: 25° C. | 3.0 | 3.5 | 3.2 | 3.2 | 3.2 | 3.4 |
|  | (200° C.) | (3.5) | (3.5) | (2.4) | (2.3) | (2.2) | (3.5) |

As can be clearly seen from Table 4, the laminated boards prepared by using the varnishes of Examples 6 to 10 are excellent in dielectric characteristics (in particular, dielectric dissipation factor) at room temperature (25° C.) and 1 GHz than those of the laminated boards of Comparative examples 8 to 11. Moreover, dielectric characteristics (in particular, dielectric dissipation factor) thereof at 90° C. are also good, and dependency on temperature change is little as compared to those of Comparative examples 8 to 12. Also, the laminated boards of Examples show lower water absorption rates as compared to those of the laminated boards of Comparative examples 8 to 12 and give better results in solder heat resistance (in particular, 288° C.) under humid conditions as compared to the laminated boards of Comparative examples 7 to 12. In addition, the laminated boards of Examples 6 to 10 have higher breaking strength and breaking elongation at room temperature (25° C.) and yield elongation at high temperature (200° C.) than those of the laminated boards of Comparative examples 7 to 12.

Examples 11 to 16, Comparative Examples 13 to 18

Resin varnishes for a metal clad laminated board were produced according to the formulation amounts as shown in Table 5.

Example 11

In a 3-liter four-nekced separable flask equipped with a thermometer, a condenser and a stirring device, 390 g of toluene and 175 g of polyphenylene ether resin (PKN4752, available from GE Japan Co.) were charged, and the mixture was heated to 90° C. and dissolved under stirring. Next, 500 g of 2,2-bis(4-cyanatophenyl)propane (Arocy B-10, available from Ciba Geigy AG) and 32 g of p-tert-butylphenol (available from Kanto Kagaku) were charged, after confirmation of dissolution and the liquid temperature was maintained at 110° C., 0.13 g of zinc naphthenate (available from Wako Pure Chemical Industries, Ltd.) was formulated in the mixture as a reaction promoter, and the mixture was reacted for about 4 hours to synthesize a phenol-modified cyanate ester oligomer solution which is compatibilized with a polyphenylene ether resin. Then, the reaction solution was cooled, and when the inner temperature reached to 80° C., 608 g of methyl ethyl ketone, 308 g of 3,3',5,5'-tetramethylbiphenol diglycidyl ether (a tetramethylbiphenyl type epoxy resin, YX-4000, available from Japan Epoxy Resin Co.) and 207 g of brominated polystyrene (PDBS-80, available from Great Lakes) were formulated in the mixture under stirring. Then, after confirmation of dissolution and the mixture was cooled to room temperature, and 0.1 g of zinc naphthenate was formulated in the mixture as a curing accelerator to prepare a resin varnish having a non-volatile concentration of about 55% by weight.

Example 12

In a 3-liter four-nekced separable flask equipped with a thermometer, a condenser and a stirring device, 350 g of toluene and 100 g of polyphenylene ether resin (PKN4752, available from GE Japan Co.) were charged, and the mixture was heated to 90° C. and dissolved under stirring. Next, 500 g of bis(3,5-dimethyl-4-cyanatophenyl)-methane (Acocy M-10, available from Ciba Geigy AG) and 47 g of p-tert-octylphenol (available from Wako Pure Chemical Industries, Ltd.) were charged, after confirmation of dissolution and the liquid temperature was maintained at 110° C., 0.25 g of cobalt naphthenate (available from Wako Pure Chemical Industries, Ltd.) was formulated in the mixture as a reaction promoter, and the mixture was reacted for about 4 hours to synthesize a phenol-modified cyanate ester oligomer solution which is compatibilized with a polyphenylene ether resin. Then, the reaction solution was cooled, and when the inner temperature reached to 80° C., 550 g of methyl ethyl ketone, 280 g of a mixed biphenyl type epoxy resin (YL-612H, available from Japan Epoxy Resin Co.) comprising biphenol diglycidyl ether and 3,3',5,5'-tetramethylbiphenol diglycidyl ether, and 178 g of a brominated polyphenylene ether (PO-64P, available from Great Lakes) were formulated in the mixture under stirring. Then, after confirmation of dissolution, the mixture was cooled to room temperature, and 0.1 g of zinc naphthenate (available from Wako Pure Chemical Industries, Ltd.) was formulated in the mixture as a curing accelerator to prepare a resin varnish having a non-volatile concentration of about 55% by weight.

Example 13

In a 3-liter four-nekced separable flask equipped with a thermometer, a condenser and a stirring device, 357 g of toluene and 150 g of polyphenylene ether resin (PKN4752, available from GE Japan Co.) were charged, and the mixture was heated to 90° C. and dissolved under stirring. Next, 500 g of 2,2-bis(4-cyanatophenyl)propane (Arocy B-10, available from Ciba Geigy AG) and 15 g of p-(α-cumyl)phenol (available from Tokyo Kasei Kogyo Co., Ltd.) were charged, after confirmation of dissolution and the liquid temperature was maintained at 110° C., 0.16 g of manganese naphthenate (available from Wako Pure Chemical Industries, Ltd.) was formulated in the mixture as a reaction promoter, and the mixture was reacted for about 4 hours to synthesize a phenol-modified cyanate ester oligomer solution which is compatibilized with a polyphenylene ether resin. Then, the reaction solution was cooled, and when the inner temperature reached to 80° C., 587 g of methyl ethyl ketone, 273 g of 3,3',5,5'-tetramethyl-biphenol diglycidyl ether (YX-4000, available from Japan Epoxy Resin Co.) and 172 g of brominated triphenylcyanurate (PYROGUARD SR-245, available from Daiich Seiyaku Kogyo Co., Ltd.) were formulated in the mixture under stirring. Then, after confirmation of dissolution and the mixture was cooled to room temperature, 46 g of p-(α-cumyl)phenol and of 0.1 g of zinc naphthenate (available from Wako Pure Chemical Industries, Ltd.) was formulated in the mixture as a curing accelerator to prepare a resin varnish having a non-volatile concentration of about 55% by weight.

Example 14

In a 3-liter four-nekced separable flask equipped with a thermometer, a condenser and a stirring device, 340 g of toluene and 180 g of polyphenylene ether resin (PKN4752, available from GE Japan Co.) were charged, and the mixture was heated to 90° C. and dissolved under stirring. Next, 450 g of α,α'-bis(4-cyanatophenyl)-m-diisopropylbenzene (RTX-366, available from Ciba Geigy AG) and 4 g of p-tert-amylphenol (available from Tokyo Kasei Kogyo Co., Ltd.) were charged, after confirmation of dissolution and the liquid temperature was maintained at 110° C., iron naphthenate (available from Kanto Kagaku) was formulated in the mixture as a reaction promoter, and the mixture was reacted for about 4 hours to synthesize a phenol-modified cyanate ester oligomer solution which is compatibilized with a polyphenylene ether resin. Then, the reaction solution was cooled, and when the inner temperature reached to 80° C., 600 g of methyl ethyl ketone, 330 g of a biphenyl aralkylene novolac type epoxy resin (NC-3000S-H, available from Nippon Kayaku Co., Ltd.) and 164 g of bis(tribromophenoxy)ethane (FF-680, available from Great Lakes) were formulated in the mixture under stirring. Then, after confirmation of dissolution, the mixture was cooled to room temperature, and 23 g of p-tert-octylphenol (available from Wako Pure Chemical Industries, Ltd.) and 0.1 g of zinc naphthenate (available from Wako Pure Chemical Industries, Ltd.) as a curing accelerator was formulated in the mixture to prepare a resin varnish having a non-volatile concentration of about 55% by weight.

Example 15

In a 3-liter four-nekced separable flask equipped with a thermometer, a condenser and a stirring device, 360 g of toluene and 225 g of polyphenylene ether resin (PKN4752, available from GE Japan Co.) were charged, and the mixture was heated to 90° C. and dissolved under stirring. Next, 450 g of a phenol novolac type cyanate ester resin (REX-371, available from Ciba Geigy AG) and 13 g of p-(α-cumyl)phenol (available from Tokyo Kasei Kogyo Co., Ltd.) were charged, after confirmation of dissolution and the liquid temperature was maintained at 110° C., 0.15 g of manganese naphthenate (available from Wako Pure Chemical Industries, Ltd.) was formulated in the mixture as a reaction promoter, and the mixture was reacted for about 3 hours to synthesize a phenol-modified cyanate ester oligomer solution which is compatibilized with a polyphenylene ether resin. Then, the reaction solution was cooled, and when the inner temperature reached to 80° C., 560 g of methyl ethyl ketone, 148 g of 3,3',5,5'-tetramethylbiphenol diglycidyl ether (YX-4000, available from Japan Epoxy Resin Co.), 90 g of a cresol novolac type epoxy resin (ESCN-190-3, available from Sumitomo Chemical Co., Ltd.) and 157 g of hexabromocyclododecane (CD-75P, available from Great Lakes) were formulated in the mixture under stirring. Then, after confirmation of dissolution and the mixture was cooled to room temperature, 45 g of p-tert-octylphenol (available from Wako Pure Chemical Industries, Ltd.) and 0.1 g of zinc naphthenate (available from Wako Pure Chemical Industries, Ltd.) was formulated in the mixture to prepare a resin varnish having a non-volatile concentration of about 55% by weight.

Example 16

In a 3-liter four-nekced separable flask equipped with a thermometer, a condenser and a stirring device, 290 g of toluene and 225 g of polyphenylene ether resin (PKN4752, available from GE Japan Co.) were charged, and the mixture was heated to 90° C. and dissolved under stirring. Next, 450 g of a phenol novolac type cyanate ester resin (REX-371, available from Ciba Geigy AG) and 13 g of p-(α-cumyl)phenol (available from Tokyo Kasei Kogyo Co., Ltd.) were charged, after confirmation of dissolution and the liquid temperature was maintained at 110° C., 0.15 g of manganese naphthenate (available from Wako Pure Chemical Industries, Ltd.) was formulated in the mixture as a reaction promoter, and the mixture was reacted for about 4 hours to synthesize a phenol-modified cyanate ester oligomer solution which is compatibilized with a polyphenylene ether resin. Then, the reaction solution was cooled, and when the inner temperature reached to 80° C., 623 g of methyl ethyl ketone, 160 g of 3,3',5,5'-tetramethyl-biphenol diglycidyl ether (YX-4000, available from Japan Epoxy Resin Co.) and 230 g of a brominated bisphenol A type epoxy resin (ESB400T, available from Sumitomo Chemical Co., Ltd.) were formulated in the mixture under stirring. Then, after confirmation of dissolution and the mixture was cooled to room temperature, 45 g of p-tert-octylphenol (available from Wako Pure Chemical Industries, Ltd.) and 0.1 g of zinc naphthenate (available from Wako Pure Chemical Industries, Ltd.) as a curing accelerator were formulated in the mixture to prepare a resin varnish having a non-volatile concentration of about 55% by weight.

Comparative Example 13

In the same manner as in Example 11 except for removing 3,3',5,5'-tetramethylbiphenol diglycidyl ether (YX-4000), and formulating the brominated polystyrene (PDBS-80, available from Great Lakes) with a formulation amount as shown in Table 5, and methyl ethyl ketone was so formulated in a formulation amount that a non-volatile concentration became about 55% by weight, the procedure was carried out as in Example 11 to prepare a resin varnish having the non-volatile concentration of about 55% by weight.

Comparative Example 14

In the same manner as in Example 11 except for formulating a bisphenol A type epoxy resin (DER-331L, available from Dow Chemical) in place of 3,3',5,5'-tetramethylbiphenol diglycidyl ether with a formulating amount as shown in Table 5, an changing a formulation amount of the brominated polystyrene (PDBS-80, available from Great Lakes) as shown in Table 5, and methyl ethyl ketone was so formulated in a formulation amount that a non-volatile concentration became about 55% by weight, the procedure was carried out as in Example 11 to prepare a resin varnish having the non-volatile concentration of about 55% by weight.

Comparative Example 15

In the same manner as in Example 11 except for formulating p-tert-amylphenol (available from Tokyo Kasei Kogyo Co., Ltd.) in place of p-tert-butylphenol, and a phenol novolac type epoxy resin (N-770, available from Dainippon Ink and Chemicals Incorporated) in place of 3,3',5,5'-tetramethylbiphenol diglycidyl ether, with formulation amounts as shown in Table 5, respectively, changing the formulation amount of the brominated polystyrene (PDBS-80, available from Great Lakes) to that as shown in Table 5, and methyl ethyl ketone was so formulated in a formulation amount that a non-volatile concentration became about 55% by weight, the procedure was carried out as in Example 11 to prepare a resin varnish having the non-volatile concentration of about 55% by weight.

Comparative Example 16

In the same manner as in Example 12 except for formulating a brominated bisphenol A (TBA, available from Teijin Chemicals, Ltd.) in place of p-tert-octylphenol, a bisphenol A novolac type epoxy resin (N-865, available from Dainippon Ink and Chemicals Incorporated) in place of a mixed biphenyl type epoxy resin (YL-612H) comprising a biphenol diglycidyl ether and 3,3',5,5'-tetramethylbiphenol diglycidyl ether, and zinc naphthenate (available from Wako Pure Chemical Industries, Ltd.) in place of cobalt naphthenate (available from Wako Pure Chemical Industries, Ltd.) with formulation amounts as shown in Table 5, respectively, removing the brominated polyphenylene ether (PO-64P), and methyl ethyl ketone was so formulated in a formulation amount that a non-volatile concentration became about 55% by weight, the procedure was carried out as in Example 12 to prepare a resin varnish having the non-volatile concentration of about 55% by weight.

Comparative Example 17

In the same manner as in Example 11 except for formulating a brominated bisphenol A (TBA, available from Teijin Chemicals, Ltd.) in place of p-tert-butylphenol, and a phenol salicylic aldehyde novolac type epoxy resin (EPPN-502H, available from Nippon Kayaku Co., Ltd.) in place of 3,3',5,5'-tetramethylbiphenol diglycidyl ether, with formulation amounts as shown in Table 5, respectively, removing the brominated polystyrene (PDBS-80, available from Great Lakes), and methyl ethyl ketone was so formulated in a formulation amount that a non-volatile concentration became about 55% by weight, the procedure was carried out as in Example 11 to prepare a resin varnish having the non-volatile concentration of about 55% by weight.

Comparative Example 18

In the same manner as in Example 16 except for formulating p-(α-cumyl)phenol (available from Tokyo Kasei Kogyo Co., Ltd.) in place of the brominated bisphenol A (TBA), and a dicyclopentadiene skeleton-containing epoxy resin (HP-7200, available from Dainippon Ink and Chemicals Incorporated) and a polymer type brominated epoxy resin (5203, available from Japan Epoxy Resin Co.) in place of a bisphenol A novolac type epoxy resin (N-685) with formulation amounts as shown in Table 5, respectively, and methyl ethyl ketone was so formulated in a formulation amount that a non-volatile concentration became about 55% by weight, the procedure was carried out as in Example 16 to prepare a resin varnish having the non-volatile concentration of about 55% by weight.

TABLE 5

| | | Example | | | | | | Comparative example | | | | | |
|---|---|---|---|---|---|---|---|---|---|---|---|---|---|
| | Item | 11 | 12 | 13 | 14 | 15 | 16 | 13 | 14 | 15 | 16 | 17 | 18 |
| Cyanate ester compound | Arocy B-10 | 500 | — | 500 | — | — | — | 500 | 500 | 500 | — | 500 | — |
| | Arocy M-10 | — | 500 | — | — | — | — | — | — | — | 500 | — | 500 |
| | RTX-366 | — | — | — | 450 | — | — | — | — | — | — | — | — |
| | REX-371 | — | — | — | — | 450 | 450 | — | — | — | — | — | — |
| Phenol compound | p-tert-butylphenol | 32 | — | — | — | — | — | 32 | 32 | — | — | — | — |
| | p-tert-octyl phenol | — | 47 | — | 23 | 45 | 45 | — | — | — | — | — | — |
| | p-(α-cumyl) phenol | — | — | 15 46 | — | 13 | 13 | — | — | — | — | — | 48 |
| | p-tert-amylphenol | — | — | — | 4 | — | — | — | — | 12 | — | — | — |
| Polyphenylene ether resin | | 175 | 100 | 150 | 180 | 225 | 225 | 175 | 175 | 175 | 100 | 175 | 100 |
| Epoxy resin | YX-4000 | 308 | — | 273 | — | 148 | 160 | — | — | — | — | — | — |
| | YL-6121H | — | 280 | — | — | — | — | — | — | — | — | — | — |
| | NC-3000S-H | — | — | — | 330 | — | — | — | — | — | — | — | — |
| | ESCN-190-3 | — | — | — | — | 90 | — | — | — | — | — | — | — |
| | DER-331L | — | — | — | — | — | — | — | 300 | — | — | — | — |
| | N-770 | — | — | — | — | — | — | — | — | 306 | — | — | — |
| | N-865 | — | — | — | — | — | — | — | — | — | 338 | — | — |
| | EPPN-502H | — | — | — | — | — | — | — | — | — | — | 313 | — |
| | HP-7200 | — | — | — | — | — | — | — | — | — | — | — | 460 |
| | ESB-400T | — | — | — | — | — | 230 | — | — | — | — | — | — |
| Flame retardant | PDBS-80 | 207 | — | — | — | — | — | 147 | 206 | 203 | — | — | — |
| | PO-64P | — | 178 | — | — | — | — | — | — | — | — | — | — |
| | SR-245 | — | — | 172 | — | — | — | — | — | — | — | — | — |
| | FF-680 | — | — | — | 165 | — | — | — | — | — | — | — | — |
| | CD-75P | — | — | — | — | 155 | — | — | — | — | — | — | — |
| | TBA | — | — | — | — | — | — | — | — | — | 205 | 215 | — |
| | EP5203 | — | — | — | — | — | — | — | — | — | — | — | 230 |

TABLE 5-continued

|  | Item | Example | | | | | | Comparative example | | | | | |
|---|---|---|---|---|---|---|---|---|---|---|---|---|---|
|  |  | 11 | 12 | 13 | 14 | 15 | 16 | 13 | 14 | 15 | 16 | 17 | 18 |
| Reaction catalyst (Curing accelerator) | Manganese naphthenate | — | — | 0.16 | — | 0.15 | 0.15 | — | — | — | — | — | — |
|  | Cobalt naphthenate | — | 0.25 | — | — | — | — | — | — | — | — | — | — |
|  | Iron naphthenate | — | — | — | 0.14 | — | — | — | — | — | — | — | — |
|  | Zinc naphthenate | 0.13 0.1 | 0.1 | 0.1 | 0.1 | 0.1 | 0.1 | 0.13 0.1 | 0.13 0.1 | 0.13 0.1 | 0.13 0.1 | 0.13 0.1 | 0.13 0.1 |
| Non-volatile concentration of varnish (% by weight) |  | 55 | 55 | 55 | 55 | 55 | 55 | 55 | 55 | 55 | 55 | 55 | 55 |

Resin varnishes obtained in Examples 11 to 16 and Comparative examples 13 to 18 were each impregnated into a glass cloth (E glass) with a thickness of 0.15 mm, and then, the material was dried at 160° C. for 4 to 7 minutes to obtain the respective prepregs with a resin solid content of 52% by weight. Then, four sheets of this prepregs were laminated, and copper foils with a thickness of each 18 μm were provided on the both outermost layers, and molding was carried out under the pressing conditions of 230° C. for 70 minutes and 2.5 MPa to prepare a both-surface copper clad laminated board. With regard to the obtained copper clad laminated board, copper foil peeling strength, dielectric characteristics, solder heat resistance, water absorption rate, flame resistance, bending characteristics, thermal expansion coefficient (α) and Tg (glass transition temperature) were evaluated. The evaluation results are shown in Table 6.

Evaluation methods of characteristics of the copper clad laminated boards are as mentioned above. Incidentally, flame resistance of copper clad laminated boards was measured according to UL-94 vertical test method.

TABLE 6

|  | Item | Example | | | | | |
|---|---|---|---|---|---|---|---|
|  |  | 11 | 12 | 13 | 14 | 15 | 16 |
| Copper foil peeling strength (kN/m) |  | 1.5 | 1.5 | 1.5 | 1.5 | 1.5 | 1.5 |
| εr | 1 GHz (25° C.) | 3.51 | 3.46 | 3.50 | 3.42 | 3.57 | 3.58 |
|  | 1 GHz (90° C.) | 3.53 | 3.47 | 3.51 | 3.44 | 3.58 | 3.59 |
| tanδ | 1 GHz (25° C.) | 0.0052 | 0.0046 | 0.0052 | 0.0040 | 0.0054 | 0.0055 |
|  | 1 GHz (90° C.) | 0.0057 | 0.0051 | 0.0057 | 0.0045 | 0.0058 | 0.0059 |
| Solder heat resistance (260° C.) (Number of no abnormality/ Number of tested) | PCT 1 h | 3/3 | 3/3 | 3/3 | 3/3 | 3/3 | 3/3 |
|  | PCT 2 h | 3/3 | 3/3 | 3/3 | 3/3 | 3/3 | 3/3 |
|  | PCT 3 h | 3/3 | 3/3 | 3/3 | 3/3 | 3/3 | 3/3 |
|  | PCT 4 h | 3/3 | 3/3 | 3/3 | 3/3 | 3/3 | 3/3 |
|  | PCT 5 h | 3/3 | 3/3 | 3/3 | 3/3 | 3/3 | 3/3 |
| (288° C.) | PCT 1 h | 3/3 | 3/3 | 3/3 | 3/3 | 3/3 | 3/3 |
|  | PCT 2 h | 3/3 | 3/3 | 3/3 | 3/3 | 3/3 | 3/3 |
|  | PCT 3 h | 3/3 | 3/3 | 3/3 | 3/3 | 3/3 | 3/3 |
|  | PCT 4 h | 1/3 | 1/3 | 2/3 | 3/3 | 2/3 | 2/3 |
|  | PCT 5 h | 1/3 | 0/3 | 1/3 | 2/3 | 1/3 | 0/3 |
| Water absorption rate (% by weight) | PCT 5 h | 0.52 | 0.5 | 0.51 | 0.47 | 0.53 | 0.54 |
| TMA | Tg (° C.) | 184 | 183 | 185 | 177 | 190 | 190 |
|  | α (ppm/° C., <Tg) | 52 | 52 | 50 | 52 | 51 | 54 |
|  | α (ppm/° C., >Tg) | 292 | 295 | 335 | 279 | 313 | 290 |
| Bending modulus(GPa) | Room temperature: 25° C. | 18 | 18 | 18 | 17 | 19 | 19 |
|  | 200° C. | 10 | 9 | 10 | 9 | 12 | 13 |
| Breaking strength(MPa) (Yield strength) | Room temperature: 25° C. | 584 | 579 | 598 | 580 | 602 | 593 |
|  | (200° C.) | (241) | (215) | (254) | (204) | (283) | (234) |
| Breaking elongation(%) (Yield strength) | Room temperature: 25° C. | 3.7 | 3.7 | 3.7 | 3.8 | 3.7 | 3.6 |
|  | (200° C.) | (3.8) | (3.6) | (3.7) | (3.7) | (3.6) | (3.5) |
| Flame resistance (UL-94) |  | V-0 | V-0 | V-0 | V-0 | V-0 | V-0 |

|  | Item | Comparative example | | | | | |
|---|---|---|---|---|---|---|---|
|  |  | 13 | 14 | 15 | 16 | 17 | 18 |
| Copper foil peeling strength (kN/m) |  | 1.5 | 1.5 | 1.4 | 1.2 | 1.2 | 1.1 |
| εr | 1 GHz (25° C.) | 3.51 | 3.61 | 3.64 | 3.67 | 3.75 | 3.83 |
|  | 1 GHz (90° C.) | 3.52 | 3.66 | 3.70 | 3.73 | 3.82 | 3.92 |
| tanδ | 1 GHz (25° C.) | 0.0050 | 0.0062 | 0.0067 | 0.0075 | 0.0073 | 0.0075 |
|  | 1 GHz (90° C.) | 0.0053 | 0.0083 | 0.0085 | 0.0092 | 0.0089 | 0.0093 |
| Solder heat resistance (260° C.) (Number of no abnormality/ Number of tested) | PCT 1 h | 3/3 | 3/3 | 3/3 | 3/3 | 3/3 | 3/3 |
|  | PCT 2 h | 3/3 | 3/3 | 3/3 | 2/3 | 1/3 | 3/3 |
|  | PCT 3 h | 2/3 | 2/3 | 3/3 | 0/3 | 0/3 | 0/3 |
|  | PCT 4 h | 1/3 | 1/3 | 3/3 | 0/3 | 0/3 | 0/3 |
|  | PCT 5 h | 0/3 | 1/3 | 3/3 | 0/3 | 0/3 | 0/3 |
| (288° C.) | PCT 1 h | 3/3 | 3/3 | 3/3 | 0/3 | 0/3 | 2/3 |

TABLE 6-continued

|  |  | | | | | | |
|---|---|---|---|---|---|---|---|
|  | PCT 2 h | 2/3 | 3/3 | 3/3 | 0/3 | 0/3 | 0/3 |
|  | PCT 3 h | 0/3 | 1/3 | 1/3 | 0/3 | 0/3 | 0/3 |
|  | PCT 4 h | 0/3 | 0/3 | 0/3 | 0/3 | 0/3 | 0/3 |
|  | PCT 5 h | 0/3 | 0/3 | 0/3 | 0/3 | 0/3 | 0/3 |
| Water absorption rate (% by weight) | PCT 5 h | 0.5 | 0.54 | 0.58 | 0.73 | 0.68 | 0.77 |
| TMA | Tg (° C.) | 185 | 175 | 188 | 185 | 183 | 167 |
|  | α (ppm/° C., <Tg) | 51 | 54 | 55 | 50 | 61 | 54 |
|  | α (ppm/° C., >Tg) | 280 | 356 | 304 | 320 | 289 | 334 |
| Bending modulus(GPa) | Room temperature: 25° C. | 18 | 18 | 18 | 17 | 17 | 17 |
|  | 200° C. | 10 | 7 | 11 | 11 | 10 | 8 |
| Breaking strength(MPa) | Room temperature: 25° C. | 486 | 532 | 521 | 487 | 459 | 487 |
| (Yield strength) | (200° C.) | (203) | (125) | (220) | (230) | (276) | (178) |
| Breaking elongation(%) | Room temperature: 25° C. | 3.0 | 3.5 | 3.2 | 3.0 | 3.0 | 3.5 |
| (Yield strength) | (200° C.) | (3.2) | (3.5) | (2.3) | (2.1) | (2.0) | (3.3) |
| Flame resistance (UL-94) |  | V-0 | V-0 | V-0 | V-0 | V-0 | V-0 |

As can be clearly seen from Table 6, the laminated boards prepared by using the varnishes of Examples 11 to 16 are excellent in dielectric characteristics (in particular, dielectric dissipation factor) at room temperature (25° C.) and 1 GHz than those of the laminated boards of Comparative examples 8 to 12. Moreover, dielectric characteristics (in particular, dielectric dissipation factor) thereof at 90° C. are also good, and dependency on temperature change is little as compared to those of Comparative examples 14 to 18. Also, the laminated boards of Examples show lower water absorption rates as compared to those of the laminated boards of Comparative examples 14 to 18 and give better results in solder heat resistance (in particular, 288° C.) under humid conditions as compared to the laminated boards of Comparative examples 13 to 18. In addition, the laminated boards of Examples 11 to 16 have higher breaking strength and breaking elongation at room temperature (25° C.) and yield elongation at high temperature (200° C.) than those of the laminated boards of Comparative examples 13 to 18. Also, excellent characteristics of the laminated boards of these Examples 11 to 16 are accomplished with ensurance of good flame resistance (V-0).

Examples 17 to 21, Comparative Examples 19 to 24

Resin varnishes for metal clad laminated boards were produced according to the formulation amounts as shown in Table 7.

Example 17

In a 3-liter four-nekced separable flask equipped with a thermometer, a condenser and a stirring device, 300 g of toluene and 175 g of polyphenylene ether resin (PKN4752, available from GE Japan Co.) were charged, and the mixture was heated to 90° C. and dissolved under stirring. Next, 500 g of 2,2-bis(4-cyanatophenyl)propane (Arocy B-10, available from Ciba Geigy AG) and 32 g of p-tert-butylphenol (available from Kanto Kagaku) were charged, after confirmation of dissolution and the liquid temperature was maintained at 110° C., 0.13 g of zinc naphthenate (available from Wako Pure Chemical Industries, Ltd.) was formulated in the mixture as a reaction promoter, and the mixture was reacted for about 3 hours to synthesize a phenol-modified cyanate ester resin-containing solution which is compatibilized with a polyphenylene ether resin. Then, the reaction solution was cooled, and when the inner temperature reached to 80° C., 530 g of methyl ethyl ketone and 308 g of 3,3',5,5'-tetramethylbiphenol diglycidyl ether (a tetramethylbiphenyl type epoxy resin, YX-4000, available from Japan Epoxy Resin Co.) were formulated in the mixture under stirring. Then, after confirmation of dissolution, the mixture was cooled to room temperature, 3.0 g of 2,6-di-tert-butyl-4-methylphenol (TBMP) as an antioxidant, and 0.1 g of zinc naphthenate as a curing accelerator were formulated in the mixture to prepare a resin varnish having a non-volatile concentration of about 55% by weight.

Example 18

In a 3-liter four-nekced separable flask equipped with a thermometer, a condenser and a stirring device, 275 g of toluene and 100 g of polyphenylene ether resin (PKN4752, available from GE Japan Co.) were charged, and the mixture was heated to 90° C. and dissolved under stirring. Next, 500 g of bis(3,5-dimethyl-4-cyanatophenyl)methane (Acocy M-10, available from Ciba Geigy AG) and 47 g of p-tert-octylphenol (available from Wako Pure Chemical Industries, Ltd.) were charged, after confirmation of dissolution and the liquid temperature was maintained at 110° C., 0.25 g of cobalt naphthenate (available from Wako Pure Chemical Industries, Ltd.) was formulated in the mixture as a reaction promoter, and the mixture was reacted for about 3 hours to synthesize a phenol-modified cyanate ester resin-containing solution which is compatibilized with a polyphenylene ether resin. Then, the reaction solution was cooled, and when the inner temperature reached to 80° C., 482 g of methyl ethyl ketone and 280 g of a mixed biphenyl type epoxy resin (YL-612H, available from Japan Epoxy Resin Co.) comprising biphenol diglycidyl ether and of 3,3',5,5'-tetramethylbiphenol diglycidyl ether were formulated in the mixture under stirring. Then, after confirmation of dissolution and the mixture was cooled to room temperature, 2.8 g 2,2'-methylene-bis-(4-methyl-6-tert-butylphenol) (MBMTBP) as an antioxidant, and 0.1 g zinc naphthenate (available from Wako Pure Chemical Industries, Ltd.) as a curing accelerator were formulated in the mixture to prepare a resin varnish having a non-volatile concentration of about 55% by weight.

Example 19

In a 3-liter four-nekced separable flask equipped with a thermometer, a condenser and a stirring device, 285 g of toluene and 150 g of polyphenylene ether resin (PKN4752, available from GE Japan Co.) were charged, and the mixture was heated to 90° C. and dissolved under stirring. Next, 500 g of 2,2-bis(4-cyanatophenyl)propane (Arocy B-10, available from Ciba Geigy AG) and 15 g of p-(α-cumyl)phenol (available from Tokyo Kasei Kogyo Co., Ltd.) were charged, after confirmation of dissolution and the liquid temperature was maintained at 110° C., 0.16 g of manganese naphthenate (available from Wako Pure Chemical Industries, Ltd.) was formulated in the mixture as a reaction promoter, and the mixture was reacted for about 3 hours to synthesize a phenol-modified cyanate ester resin-containing solution which is compatibilized with a polyphenylene ether resin. Then, the reaction solution was cooled, and when the inner temperature reached to 80° C., 522 g of methyl ethyl ketone and 273 g of 3,3',5,5'-tetramethylbiphenol diglycidyl ether (YX-4000, available from Japan Epoxy Resin Co.) were formulated in the mixture under stirring. Then, after confirmation of dissolution and the mixture was cooled to room temperature, 46 g of p-α-cumyl)phenol, 3.0 g of 4,4'-butylidenebis(3-methyl-6-tertbutylphenol) (BBMTBP) as an antioxidant, and 0.1 g of zinc naphthenate (available from Wako Pure Chemical Industries, Ltd.) as a curing accelerator were formulated in the mixture to prepare a resin varnish having a non-volatile concentration of about 55% by weight.

Example 20

In a 3-liter four-nekced separable flask equipped with a thermometer, a condenser and a stirring device, 270 g of toluene and 180 g of polyphenylene ether resin (PKN4752, available from GE Japan Co.) were charged, and the mixture was heated to 90° C. and dissolved under stirring. Next, 450 g of α,α'-bis(4-cyanatophenyl)-m-diisopropylbenzene (RTX-366, available from Ciba Geigy AG) and 4 g of p-tert-amylphenol (available from Tokyo Kasei Kogyo Co., Ltd.) were charged, after confirmation of dissolution and the liquid temperature was maintained at 110° C., of 0.14 g iron naphthenate (available from Kanto Kagaku) was formulated in the mixture as a reaction promoter, and the mixture was reacted for about 3 hours to synthesize a phenol-modified cyanate ester resin-containing solution which is compatibilized with a polyphenylene ether resin. Then, the reaction solution was cooled, and when the inner temperature reached to 80° C., 540 g of methyl ethyl ketone and 330 g of a biphenyl aralkylene novolac type epoxy resin (NC-3000S-H, available from Nippon Kayaku Co., Ltd.) were formulated in the mixture under stirring. Then, after confirmation of dissolution and the mixture was cooled to room temperature, 23 g of p-tert-octylphenol (available from Wako Pure Chemical Industries, Ltd.), 3.0 g of 4,4'-butylidenebis(3-methyl-6-tert-butylphenol) (BBMTBP) as an antioxidant, and 0.1 g of zinc naphthenate (available from Wako Pure Chemical Industries, Ltd.) as a curing accelerator were formulated in the mixture to prepare a resin varnish having a non-volatile concentration of about 55% by weight.

Example 21

In a 3-liter four-nekced separable flask equipped with a thermometer, a condenser and a stirring device, 290 g of toluene and 225 g of polyphenylene ether resin (PKN4752, available from GE Japan Co.) were charged, and the mixture was heated to 90° C. and dissolved under stirring. Next, 450 g of a phenol novolac type cyanate ester resin (REX-371, available from Ciba Geigy AG) and 13 g of p-(α-cumyl) phenol (available from Tokyo Kasei Kogyo Co., Ltd.) were charged, after confirmation of dissolution and the liquid temperature was maintained at 110° C., 0.15 g of manganese naphthenate (available from Wako Pure Chemical Industries, Ltd.) was formulated in the mixture as a reaction promoter, and the mixture was reacted for about 2 hours to synthesize a phenol-modified cyanate ester resin-containing solution which is compatibilized with a polyphenylene ether resin. Then, the reaction solution was cooled, and when the inner temperature reached to 80° C., 500 g of methyl ethyl ketone, 148 g of 3,3',5,5'-tetramethylbiphenol diglycidyl ether (YX-4000, available from Japan Epoxy Resin Co.) and 90 g of a cresol novolac type epoxy resin (ESCN-190-3, available from Sumitomo Chemical Co., Ltd.) were formulated in the mixture under stirring, and after comfirmation of dissolution and the mixture was cooled to room temperature, 45 g of p-tert-octylphenol (available from Wako Pure Chemical Industries, Ltd.), 2.7 g of dilaurylthiodipropionate as an antioxidant, and 0.1 g of zinc naphthenate (available from Wako Pure Chemical Industries, Ltd.) as a curing accelerator were formulated in the mixture to prepare a resin varnish having a non-volatile concentration of about 55% by weight.

Comparative Example 19

In the same manner as in Example 17 except for removing 3,3',5,5'-tetramethylbiphenol diglycidyl ether (YX-4000) and 2,6-di-tert-butyl-4-methylphenol (TBMP), and methyl ethyl ketone was so formulated in a formulation amount that a non-volatile concentration became about 55% by weight, the procedure was carried out as in Example 17 to prepare a resin varnish having the non-volatile concentration of about 55% by weight.

Comparative Example 20

In the same manner as in Example 17 except for removing 2,6-di-tert-butyl-4-methylphenol (TBMP), and formulating a bisphenol A type epoxy resin (DER-331L, available from Dow Chemical) in place of 3,3',5,5'-tetra-methylbiphenol diglycidyl ether with a formulation amount as shown in Table 7, and methyl ethyl ketone was so formulated in a formulation amount that a non-volatile concentration became about 55% by weight, the procedure was carried out as in Example 7 to prepare a resin varnish having the non-volatile concentration of about 55% by weight.

Comparative Example 21

In the same manner as in Example 17 except for removing 2,6-di-tert-butyl-4-methylphenol (TBMP), and formulating p-tert-amylphenol (available from Tokyo Kasei Kogyo Co., Ltd.) in place of p-tert-butylphenol, a phenol novolac type epoxy resin (N-770, available from Dainippon Ink and Chemicals Incorporated) in place of 3,3',5,5'-tetramethylbiphenol diglycidyl ether with formulation amounts as shown in Table 7, respectively, and methyl ethyl ketone was so formulated in a formulation amount that a non-volatile concentration became about 55% by weight, the procedure was carried out as in Example 17 to prepare a resin varnish having the non-volatile concentration of about 55% by weight.

Comparative Example 22

In the same manner as in Example 18 except for removing 2,2'-methylene-bis-(4-methyl-6-tert-butylphenol) (MB-MTBP), formulating a bisphenol A novolac type epoxy resin (N-865, available from Dainippon Ink and Chemicals Incorported) in place of the mixed biphenyl type epoxy resin (YL-612H) comprising biphenol diglycidyl ether and 3,3',5, 5'-tetramethylbiphenol diglycidyl ether, and zinc naphthenate (available from Wako Pure Chemical Industries, Ltd.) in place of cobalt naphthenate (available from Wako Pure Chemical Industries, Ltd.) with formulation amounts as shown in Table 7, respectively, and methyl ethyl ketone was so formulated in a formulation amount that a non-volatile concentration became about 55% by weight, the procedure was carried out as in Example 18 to prepare a resin varnish having the non-volatile concentration of about 55% by weight.

Comparative Example 23

In the same manner as in Example 17 except for removing 2,6-di-tert-butyl-4-methylphenol (TBMP), formulating p-tert-octylphenol (available from Wako Pure Chemical Industries, Ltd.) in place of p-tert-butylphenol, and a phenol salicylic aldehyde novolac type epoxy resin (EPPN-502H, available from Nippon-Kayaku Co., Ltd.) in place of 3,3',5,5'-tetramethylbiphenol diglycidyl ether with formulation amounts as shown in Table 7, respectively, and methyl ethyl ketone was so formulated in a formulation amount that a non-volatile concentration became about 55% by weight, the procedure was carried out as in Example 17 to prepare a resin varnish having the non-volatile concentration of about 55% by weight.

Comparative Example 24

In the same manner as in Comparative example 21 except for formulating p-(α-cumyl)phenol (available from Tokyo Kasei Kogyo Co., Ltd.) in place of p-tert-octylphenol and a dicyclopentadiene skeleton-containing epoxy resin (HP-7200, available from Dainippon Ink and Chemicals Incorporated) in place of a bisphenol A novolac type epoxy resin (N-685) with formulation amounts as shown in Table 7, respectively, and methyl ethyl ketone was so formulated in a formulation amount that a non-volatile concentration became about 55% by weight, the procedure was carried out as in Comparative example 21 to prepare a resin varnish having the non-volatile concentration of about 55% by weight.

TABLE 7

| | | Example | | | | | Comparative example | | | | | |
|---|---|---|---|---|---|---|---|---|---|---|---|---|
| Item | | 17 | 18 | 19 | 20 | 21 | 19 | 20 | 21 | 22 | 23 | 24 |
| Cyanate ester compound | Arocy B-10 | 500 | — | 500 | — | — | 500 | 500 | 500 | — | 500 | — |
| | Arocy M-10 | — | 500 | — | — | — | — | — | — | 500 | — | 500 |
| | RTX-366 | — | — | — | 450 | — | — | — | — | — | — | — |
| | REX-371 | — | — | — | — | 450 | — | — | — | — | — | — |
| Phenol compound | p-tert-butylphenol | 32 | — | — | — | — | 32 | 32 | — | — | — | — |
| | p-tert-octylphenol | — | 47 | — | 23 | 45 | — | — | — | 47 | 44 | — |
| | p-(α-cumyl) phenol | — | — | 15 46 | — | 13 | — | — | — | — | — | 48 |
| | p-tert-amylphenol | — | — | — | 4 | — | — | — | 12 | — | — | — |
| Polyphenylene ether resin | | 175 | 100 | 150 | 180 | 225 | 175 | 175 | 175 | 100 | 175 | 100 |
| Epoxy resin | YX-4000 | 308 | — | 273 | — | 148 | — | — | — | — | — | — |
| | YL-6121H | — | 280 | — | — | — | — | — | — | — | — | — |
| | NC-3000S-H | — | — | — | 330 | — | — | — | — | — | — | — |
| | ESCN-190-3 | — | — | — | — | 90 | — | — | — | — | — | — |
| | DER-331L | — | — | — | — | — | — | 300 | — | — | — | — |
| | N-770 | — | — | — | — | — | — | — | 306 | — | — | — |
| | N-865 | — | — | — | — | — | — | — | — | 338 | — | — |
| | EPPN-502H | — | — | — | — | — | — | — | — | — | 313 | — |
| | HP-7200 | — | — | — | — | — | — | — | — | — | — | 460 |
| Antioxidant | TBMP | 3.0 | — | — | — | — | — | — | — | — | — | — |
| | MBMTBP | — | 2.8 | — | — | — | — | — | — | — | — | — |
| | BBMTBP | — | — | 3.0 | 3.0 | — | — | — | — | — | — | — |
| | Dilaurylthiodipropionate | — | — | — | — | 2.7 | — | — | — | — | — | — |
| Reaction catalyst (Curing accelerator) | Manganese naphthenate | — | — | 0.16 | — | 0.15 | — | — | — | — | — | — |
| | Cobalt naphthenate | — | 0.25 | — | — | — | — | — | — | — | — | — |
| | Iron naphthenate | — | — | — | 0.14 | — | — | — | — | — | — | — |
| | Zinc naphthenate | 0.13 0.1 | 0.1 | 0.1 | 0.1 | 0.1 | 0.13 0.1 | 0.13 0.1 | 0.13 0.1 | 0.13 0.1 | 0.13 0.1 | 0.13 0.1 |
| Non-volatile concentration of varnish (% by weight) | | 55 | 55 | 55 | 55 | 55 | 55 | 55 | 55 | 55 | 55 | 55 |

Resin varnishes obtained in Examples 17 to 21 and Comparative examples 19 to 24 were each impregnated into a glass cloth (E glass) with a thickness of 0.15 mm, and then, the material was dried at 160° C. for 4 to 7 minutes to obtain the respective prepregs with a resin solid content of 52% by weight. Then, four sheets of this prepregs were laminated, anc copper foils with a thickness of each 18 μm were provided on the both outermost layers, and molding was carried out under the pressing conditions of 230° C. for 70 minutes and 2.5 MPa to prepare a both-surface copper clad laminated board. With regard to the obtained copper clad laminated board, copper foil peeling strength, dielectric characteristics, solder heat resistance, water absorption rate, electrical corrosion resistance, bending characteristics, thermal expansion coefficient (α) and Tg (glass transition temperature) were evaluated. The evaluation results are shown in Table 8.

Evaluation methods of characteristics of the copper clad laminated boards are as mentioned above.

Electrical corrosion resistance of the copper clad laminated boards was carried our by preparing a test pattern wiring board which had been prepared by penetrating through holes with a hole-distance of 350 μm (drilling conditions; rotation number: 80,000 rpm, feed rate: 2,400 mm/min) to a copper clad laminated board using a drill having a diameter of 0.4 mm, and then, subjecting to through hole plating according to the conventional manner. To the respective test pieces was applied 100 V under 85° C./85% RH atmosphere and a time until connection breakage occurs was measured.

TABLE 8

| Item | | Example 17 | Example 18 | Example 19 | Example 20 | Example 21 |
|---|---|---|---|---|---|---|
| Copper foil peeling strength (kN/m) | | 1.5 | 1.5 | 1.5 | 1.5 | 1.5 |
| $\epsilon r$ | 1 GHz (25° C.) | 3.50 | 3.45 | 3.50 | 3.41 | 3.57 |
| | 1 GHz (90° C.) | 3.52 | 3.46 | 3.52 | 3.42 | 3.58 |
| $\tan\delta$ | 1 GHz (25° C.) | 0.0053 | 0.004 | 0.0052 | 0.0040 | 0.0054 |
| | 1 GHz (90° C.) | 0.0057 | 0.0051 | 0.0057 | 0.0045 | 0.0058 |
| Solder heat resistance (260° C.) (Number of no abnormality/ Number of tested) (288° C.) | PCT 1 h | 3/3 | 3/3 | 3/3 | 3/3 | 3/3 |
| | PCT 2 h | 3/3 | 3/3 | 3/3 | 3/3 | 3/3 |
| | PCT 3 h | 3/3 | 3/3 | 3/3 | 3/3 | 3/3 |
| | PCT 4 h | 3/3 | 3/3 | 3/3 | 3/3 | 3/3 |
| | PCT 5 h | 3/3 | 3/3 | 3/3 | 3/3 | 3/3 |
| | PCT 1 h | 3/3 | 3/3 | 3/3 | 3/3 | 3/3 |
| | PCT 2 h | 3/3 | 3/3 | 3/3 | 3/3 | 3/3 |
| | PCT 3 h | 3/3 | 3/3 | 3/3 | 3/3 | 3/3 |
| | PCT 4 h | 1/3 | 2/3 | 2/3 | 3/3 | 2/3 |
| | PCT 5 h | 1/3 | 0/3 | 0/3 | 3/3 | 1/3 |
| Water absorption rate (% by weight) | PCT 5 h | 0.52 | 0.50 | 0.52 | 0.48 | 0.54 |
| TMA | Tg (° C.) | 185 | 186 | 184 | 177 | 195 |
| | α (ppm/° C., <Tg) | 51 | 54 | 48 | 55 | 51 |
| | α (ppm/° C., >Tg) | 301 | 303 | 294 | 289 | 302 |
| Bending modulus(GPa) | Room temperature: 25° C. | 18 | 18 | 18 | 17 | 19 |
| | 200° C. | 10 | 9 | 10 | 9 | 13 |
| Breaking strength(MPa) (Yield strength) | Room temperature: 25° C. (200° C.) | 586 (239) | 579 (231) | 600 (229) | 578 (204) | 626 (287) |
| Breaking elongation(%) (Yield strength) | Room temperature: 25° C. (200° C.) | 3.7 (3.7) | 3.7 (3.8) | 3.9 (3.8) | 3.7 (3.8) | 3.8 (3.7) |
| Electrical corrosion resistance (Number of days until connection breakage) | | >500 | >500 | >500 | >500 | >500 |

| Item | | Comp. ex. 19 | Comp. ex. 20 | Comp. ex. 21 | Comp. ex. 22 | Comp. ex. 23 | Comp. ex. 24 |
|---|---|---|---|---|---|---|---|
| Copper foil peeling strength (kN/m) | | 1.5 | 1.5 | 1.4 | 1.4 | 1.4 | 1.4 |
| $\epsilon r$ | 1 GHz (25° C.) | 3.50 | 3.60 | 3.63 | 3.52 | 3.60 | 3.50 |
| | 1 GHz (90° C.) | 3.51 | 3.65 | 3.69 | 3.59 | 3.66 | 3.58 |
| $\tan\delta$ | 1 GHz (25° C.) | 0.0050 | 0.0062 | 0.0067 | 0.0065 | 0.0066 | 0.0054 |
| | 1 GHz (90° C.) | 0.0053 | 0.0083 | 0.0085 | 0.0082 | 0.0080 | 0.0066 |
| Solder heat resistance (260° C.) (Number of no abnormality/ Number of tested) (288° C.) | PCT 1 h | 3/3 | 3/3 | 3/3 | 3/3 | 3/3 | 3/3 |
| | PCT 2 h | 3/3 | 3/3 | 3/3 | 3/3 | 3/3 | 3/3 |
| | PCT 3 h | 2/3 | 2/3 | 3/3 | 3/3 | 3/3 | 3/3 |
| | PCT 4 h | 1/3 | 1/3 | 3/3 | 3/3 | 3/3 | 1/3 |
| | PCT 5 h | 0/3 | 1/3 | 3/3 | 3/3 | 2/3 | 1/3 |
| | PCT 1 h | 3/3 | 3/3 | 3/3 | 3/3 | 3/3 | 3/3 |
| | PCT 2 h | 2/3 | 3/3 | 3/3 | 3/3 | 3/3 | 3/3 |
| | PCT 3 h | 0/3 | 1/3 | 2/3 | 2/3 | 1/3 | 0/3 |
| | PCT 4 h | 0/3 | 0/3 | 0/3 | 0/3 | 0/3 | 0/3 |
| | PCT 5 h | 0/3 | 0/3 | 0/3 | 0/3 | 0/3 | 0/3 |
| Water absorption rate (% by weight) | PCT 5 h | 0.50 | 0.54 | 0.58 | 0.58 | 0.62 | 0.53 |
| TMA | Tg (° C.) | 185 | 175 | 188 | 191 | 191 | 185 |
| | α (ppm/° C., <Tg) | 50 | 55 | 51 | 51 | 63 | 59 |
| | α (ppm/° C., >Tg) | 285 | 377 | 322 | 328 | 278 | 350 |
| Bending modulus(GPa) | Room temperature: 25° C. | 18 | 18 | 18 | 18 | 18 | 18 |
| | 200° C. | 11 | 7 | 12 | 13 | 13 | 9 |
| Breaking strength(MPa) (Yield strength) | Room temperature: 25° C. (200° C.) | 488 (210) | 558 (142) | 516 (244) | 502 (232) | 512 (286) | 535 (189) |
| Breaking elongation(%) (Yield strength) | Room temperature: 25° C. (200° C.) | 3.0 (3.5) | 3.5 (3.5) | 3.2 (2.4) | 3.2 (2.3) | 3.2 (2.2) | 3.4 (3.5) |
| Electrical corrosion resistance (Number of days until connection breakage) | | 240 | 288 | 168 | 72 | 36 | 144 |

As can be clearly seen from Table 8, the laminated boards prepared by using the varnishes of Examples 17 to 21 are excellent in dielectric characteristics (in particular, dielectric dissipation factor) at room temperature (25° C.) and 1 GHz than those of the laminated boards of Comparative examples 20 to 23. Moreover, dielectric characteristics (in particular, dielectric dissipation factor) thereof at 90° C. are also good, and dependency on temperature change is little as compared to those of Comparative examples 20 to 24. Also, the laminated boards of Examples show lower water absorption rates as compared to those of the laminated boards of Comparative examples 20 to 24 and give better results in solder heat resistance (in particular, 288° C.) under humid conditions as compared to the laminated boards of Comparative examples 19 to 24. In addition, the laminated boards of Examples 17 to 21 have higher breaking strength and breaking elongation at room temperature (25° C.) and yield elongation at high temperature (200° C.) than those of the laminated boards of Comparative examples 19 to 24. Also, the laminated boards of Examples 17 to 21 show better electrical corrosion resistance as compared with those of the laminated boards of Comparative example.

EFFECTS OF THE INVENTION

According to the first invention of the present invention, it could be found that cured products using the resin composition for printed wiring board of the present invention are excellent in dielectric characteristics at high frequency band region, and a drifting property of dielectric characteristics due to change in temperature is also little. Also, they have high bending strength and elongation at glass state region and elongation at high temperatures region. Moreover, the metal clad laminated boards prepared by using the present resin composition for printed wiring board are excellent in humidity and heat resistance under severe conditions using a pressure cooker tester. Accordingly, they can be expected to be members or parts for a printed wiring board to be used for various kinds of electric and electronic devices which treats high frequency signals of 1 GHz or higher. In particular, the excellent high frequency characteristics and bending characteristics, and high humidity and heat resistance which are characteristics of the resin composition of the present invention are effective for the uses of laminated boards and prepregs to be used for a multi-layered printed wiring board such as a high speed server, router and high speed base station devices, which are required to have heat resistance or crack resistance under severe conditions.

According to the second invention of the present invention, it could be found that cured products using the resin composition for printed wiring board of the present invention are excellent in dielectric characteristics at high frequency band region, and a drifting property of dielectric characteristics due to change in temperature is also little. Also, they have high bending strength and elongation at glass state region and elongation at high temperatures region. Moreover, the metal clad laminated boards prepared by using the present resin composition for printed wiring board containing a flame retardant gives good flame resistance in addition to these excellent characteristics. Also, the present resin composition for printed wiring board containing an antioxidant gives good electric corrosion resistance in addition to these excellent characteristics. Accordingly, they can be expected to be members or parts for a printed wiring board to be used for various kinds of electric and electronic devices which treats high frequency signals of 1 GHz or higher. In particular, the excellent high frequency characteristics and bending characteristics, and high humidity and heat resistance which are characteristics of the resin composition of the present invention are effective for the uses of laminated boards and prepregs to be used for a multi-layered printed wiring board such as a high speed server, router and high speed base station devices, which are required to have heat resistance or crack resistance under severe conditions.

The invention claimed is:

1. A resin composition for printed wiring board which comprises a cyanate ester compound having 2 or more cyanate groups in the molecule and/or a prepolymer thereof, an epoxy resin containing at least one kind of an epoxy resin having a biphenyl structure in the molecule, and a monovalent phenol compound, and which further comprises a polyphenylene ether resin, wherein the epoxy resin containing at least one kind of an epoxy resin having a biphenyl structure in the molecule is contained in an amount of 10 to 250 parts by weight based on 100 parts by weight of the cyanate ester compound having 2 or more cyanate groups in the molecule and/or a prepolymer thereof.

2. A resin composition for printed wiring board which comprises a phenol-modified cyanate ester oligomer obtained by reacting a cyanate ester compound having 2 or more cyanate groups in the molecule and/or a prepolymer thereof, a monovalent phenol compound, then mixing an epoxy resin containing at least one kind of an epoxy resin having a biphenyl structure in the molecule, and which further comprises a poly-phenylene ether resin.

3. A resin composition for printed wiring board which comprises an epoxy/phenol-modified cyanate ester oligomer obtained by reacting a cyanate ester compound having 2 or more cyanate groups in the molecule and/or a prepolymer thereof, an epoxy resin containing at least one kind of an epoxy resin having a biphenyl structure in the molecule, and a monovalent phenol compound, and wherein the composition further comprises a polyphenylene ether resin.

4. A resin composition for printed wiring board which comprises an epoxy/phenol-modified cyanate ester oligomer obtained by reacting a cyanate ester compound having 2 or more cyanate groups in the molecule and/or a prepolymer thereof, a monovalent phenol compound and an epoxy resin containing at least one kind of an epoxy resin having a biphenyl structure in the molecule in the presence of a polyphenylene ether resin.

5. The resin composition for printed wiring board according to claim 1, wherein the monovalent phenol compound is contained in an amount of 2 to 60 parts by weight based on 100 parts by weight of the cyanate ester compound having 2 or more cyanate groups in the molecule and/or a prepolymer thereof.

6. The resin composition for printed wiring board according to claim 1, wherein the cyanate ester compound having 2 or more cyanate groups in the molecule and/or a prepolymer thereof is at least one selected from the group consisting of a cyanate ester compound represented by the formula (I):

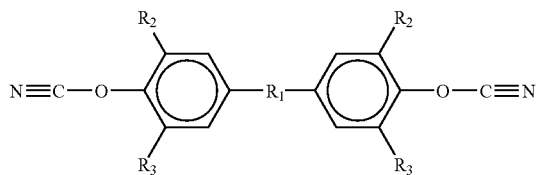

Formula (I)

wherein $R_1$ represents

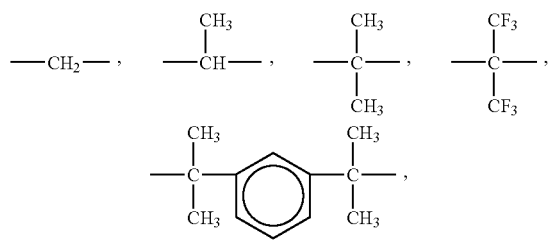

or

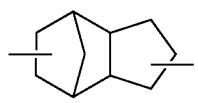

$R_2$ and $R_3$ each represent a hydrogen atom or an alkyl group having 1 to 4 carbon atoms, and each is the same or different from each other,
and a cyanate ester compound represented by the formula (II):

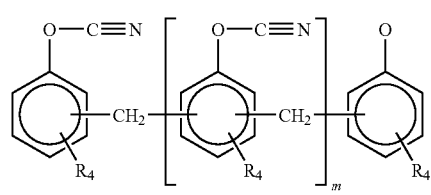

Formula (II)

wherein $R_4$ represents a hydrogen atom or an alkyl group having 1 to 4 carbon atoms, m represents an integer of 1 to 7,
and a prepolymer thereof.

7. The resin composition for printed wiring board according to claim 1, wherein the epoxy resin having a biphenyl structure in the molecule in the epoxy resin containing at least one kind of an epoxy resin having a biphenyl structure in the molecule is at least one selected from the group consisting of an epoxy resin represented by the formula (III):

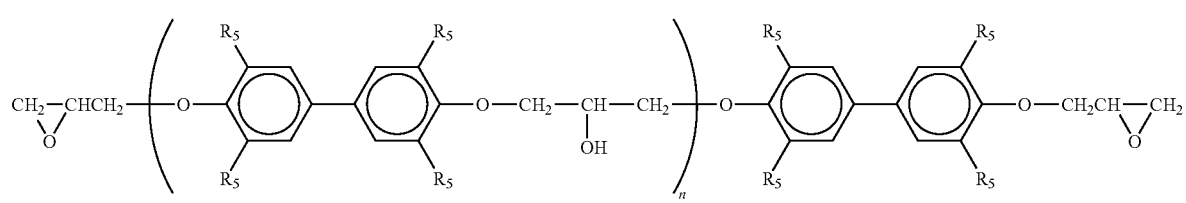

Formula (III)

wherein $R_5$ each represent a hydrogen atom or a methyl group, n represents an integer of 0 to 6, and an epoxy resin represented by the formula (IV):

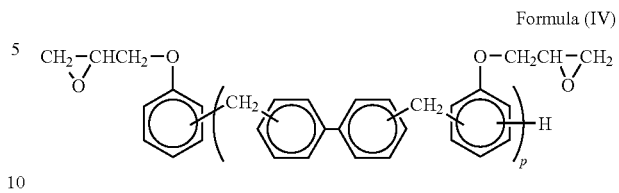

Formula (IV)

wherein p represents an integer of 1 to 5.

8. The resin composition for printed wiring board according to claim 1, wherein the composition further comprises, as a flame retardant, at least one selected from the group consisting of 1,2-dibromo-4-(1,2-dibromoethyl)cyclohexane, tetrabromocyclooctane, hexabromocyclododecane, bis(tribromophenoxy)ethane, a brominated triphenylcyanurate represented by the formula (VII):

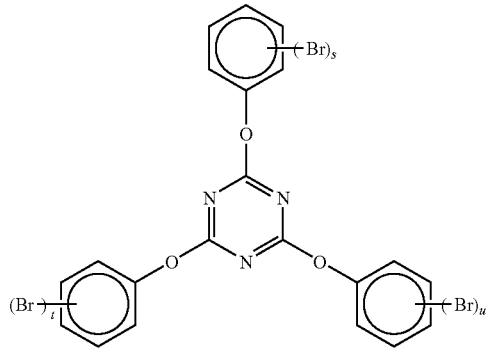

Formula (VII)

wherein s, t and u each represent an integer of 1 to 5, and each is the same value or different from each other,
a brominated polyphenylene ether and a brominated polystyrene.

9. The resin composition for printed wiring board according to claim 1, which further comprises an antioxidant.

10. A resin varnish for a printed wiring board obtained by dissolving or dispersing the resin composition for printed wiring board according to claim 1 in a solvent.

11. The resin composition for printed wiring board according to claim 2, wherein the phenol-modified cyanate ester oligomer is a phenol-modified cyanate ester oligomer obtained by reacting 100 parts by weight of the cyanate ester compound having 2 or more cyanate groups in the molecule and/or a prepolymer thereof, and 2 to 60 parts by weight of the monovalent phenol compound, and the epoxy resin compound containing at least one kind of an epoxy resin having a biphenyl structure in the molecule is contained in an amount of 10 to 250 parts by weight.

12. The resin composition for printed wiring board according to claim 2, wherein the cyanate ester compound having 2 or more cyanate groups in the molecule and/or a prepolymer thereof is at least one selected from the group consisting of a cyanate ester compound represented by the formula (I):

Formula (I)

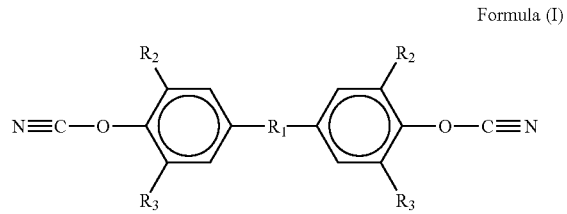

wherein $R_1$ represents

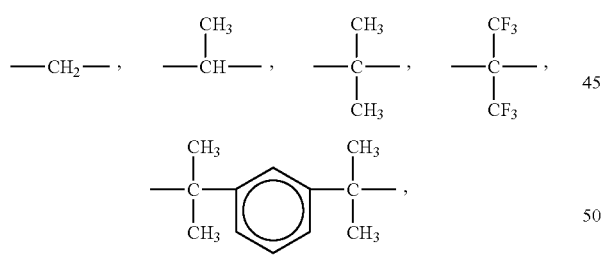

or

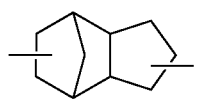

$R_2$ and $R_3$ each represent a hydrogen atom or an alkyl group having 1 to 4 carbon atoms, and each is the same or different from each other, and a cyanate ester compound represented by the formula (II):

Formula (II)

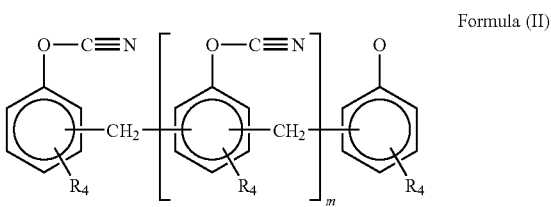

wherein $R_4$ represents a hydrogen atom or an alkyl group having 1 to 4 carbon atoms, m represents an integer of 1 to 7, and a prepolymer thereof.

13. The resin composition for printed wiring board according to claim 2, wherein the epoxy resin having a biphenyl structure in the molecule in the epoxy resin containing at least one kind of an epoxy resin having a biphenyl structure in the molecule is at least one selected from the group consisting of an epoxy resin represented by the formula (III):

Formula (III)

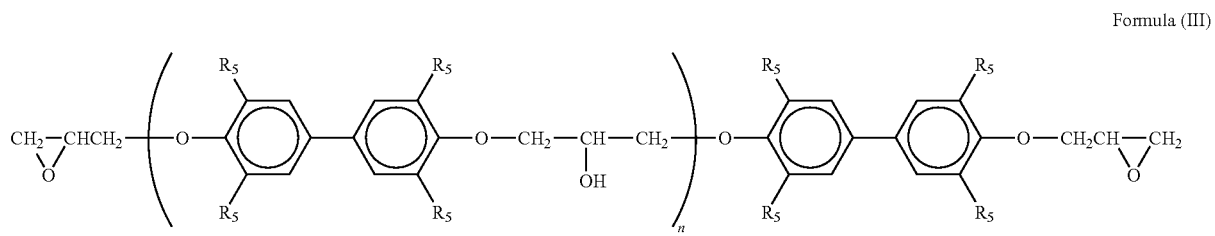

wherein $R_5$ each represent a hydrogen atom or a methyl group, n represents an integer of 0 to 6, and an epoxy resin represented by the formula (IV):

Formula (IV)

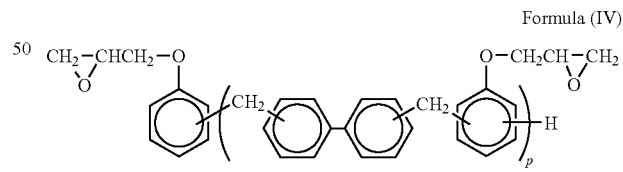

wherein p represents an integer of 1 to 5.

14. The resin composition for printed wiring board according to claim 2, wherein the composition further comprises at least one selected from the group consisting of 1,2-dibromo-4-(1,2-dibromoethyl)cyclohexane, tetrabromocyclooctane, hexabromocyclododecane, bis(tribromophenoxy)ethane, a brominated triphenylcyanurate represented by the formula (VII):

Formula (VII)

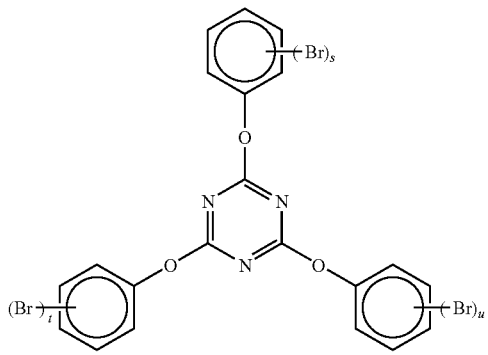

wherein s, t and u each represent an integer of 1 to 5, and each is the same value or different from each other, a brominated polyphenylene ether and a brominated polystyrene, as a flame retardant.

15. The resin composition for printed wiring board according to claim 2, which further comprises an antioxidant.

16. A resin varnish for a printed wiring board obtained by dissolving or dispersing the resin composition for printed wiring board according to claim 2 in a solvent.

17. The resin composition for printed wiring board according to claim 3, wherein the epoxy/phenol-modified cyanate ester oligomer is an epoxy/phenol-modified cyanate ester oligomer obtained by reacting 100 parts by weight of the cyanate ester compound having 2 or more cyanate groups in the molecule and/or a prepolymer thereof, 10 to 250 parts by weight of the epoxy resin containing at least one kind of an epoxy resin having a biphenyl structure in the molecule, and 2 to 60 parts by weight of the monovalent phenol compound.

18. The resin composition for printed wiring board according to claim 3, wherein the cyanate ester compound having 2 or more cyanate groups in the molecule and/or a prepolymer thereof is at least one selected from the group consisting of a cyanate ester compound represented by the formula (I):

Formula (I)

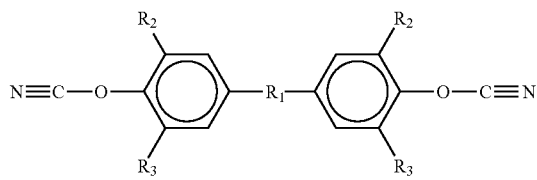

wherein $R_1$ represents $$-CH_2-,\quad \begin{array}{c}CH_3\\|\\-CH-\end{array},\quad \begin{array}{c}CH_3\\|\\-C-\\|\\CH_3\end{array},\quad \begin{array}{c}CF_3\\|\\-C-\\|\\CF_3\end{array},$$

$$\begin{array}{c}CH_3\\|\\-C-\\|\\CH_3\end{array}\!\!-\!\!\!\phantom{X}\!\!\!-\!\!\!\begin{array}{c}CH_3\\|\\-C-\\|\\CH_3\end{array},$$

or

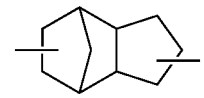

$R_2$ and $R_3$ each represent a hydrogen atom or an alkyl group having 1 to 4 carbon atoms, and each is the same or different from each other, and a cyanate ester compound represented by the formula (II):

Formula (II)

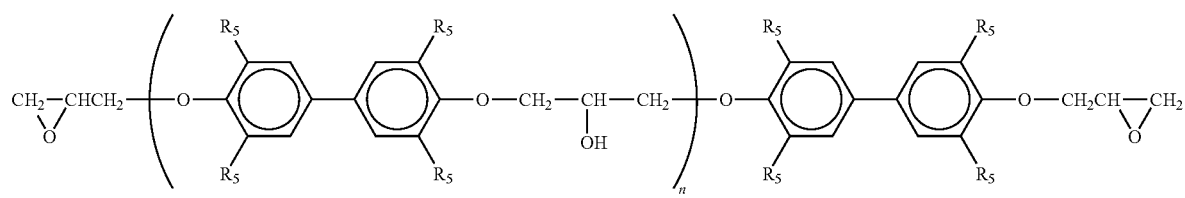

wherein $R_4$ represents a hydrogen atom or an alkyl group having 1 to 4 carbon atoms, m represents an integer of 1 to 7, and a prepolymer thereof.

19. The resin composition for printed wiring board according to claim 3, wherein the epoxy resin having a biphenyl structure in the molecule in the epoxy resin containing at least one kind of an epoxy resin having a biphenyl structure in the molecule is at least one selected from the group consisting of an epoxy resin represented by the formula (III):

Formula (III)

wherein $R_5$ each represent a hydrogen atom or a methyl group, n represents an integer of 0 to 6,
and an epoxy resin represented by the formula (IV):

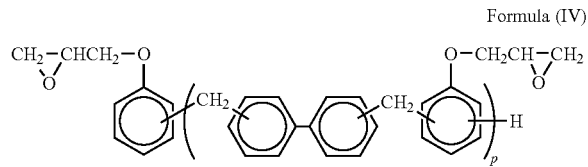

Formula (IV)

wherein p represents an integer of 1 to 5.

20. The resin composition for printed wiring board according to claim 3, wherein the composition further comprises at least one selected from the group consisting of 1,2-dibromo-4-(1,2-dibromoethyl)cyclohexane, tetrabromocyclooctane, hexabromocyclododecane, bis(tribromophenoxy)ethane, a brominated triphenylcyanurate represented by the formula (VII):

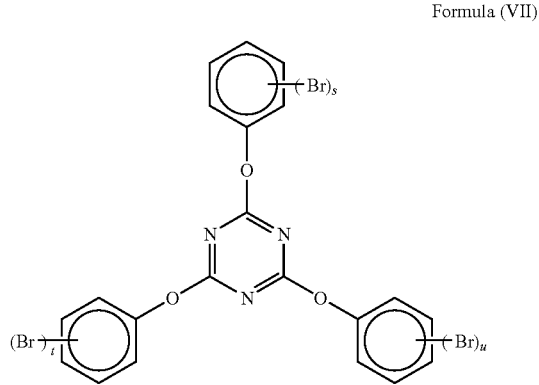

Formula (VII)

wherein s, t and u each represent an integer of 1 to 5, and each is the same value or different from each other,
a brominated polyphenylene ether and a brominated polystyrene, as a flame retardant.

21. The resin composition for printed wiring board according to claim 3, which further comprises an antioxidant.

22. A resin varnish for a printed wiring board obtained by dissolving or dispersing the resin composition for printed wiring board according to claim 3 in a solvent.

23. A resin varnish for a printed wiring board obtained by dissolving or dispersing the resin composition for printed wiring board according to claim 4 in a solvent.

24. The resin composition for printed wiring board according to claim 1, wherein said epoxy resin having a biphenyl structure in the molecule is a biphenyl epoxy resin.

25. The resin composition for printed wiring board according to claim 1, wherein said epoxy resin containing at least one kind of an epoxy resin having a biphenyl structure is contained in an amount of 10 to 150 parts by weight based on 100 parts by weight of the cyanate ester having 2 or more cyanate groups in the molecule and/or a prepolymer thereof.

26. The resin composition for printed wiring board according to claim 1, wherein said epoxy resin containing at least one kind of an epoxy resin having a biphenyl structure is contained in an amount of 10 to 100 parts by weight based on 100 parts by weight of the cyanate ester having 2 or more cyanate groups in the molecule and/or a prepolymer thereof.

27. The resin composition for printed wiring board according to claim 1, wherein an amount of said at least one kind of an epoxy resin having a biphenyl structure is at least 50% by weight of a total weight of said epoxy resin in the resin composition.

28. The resin composition for printed wiring board according to claim 1, wherein an amount of said at least one kind of an epoxy resin having a biphenyl structure is at least 70% by weight of a total weight of said epoxy resin in the resin composition.

29. The resin composition for printed wiring board according to claim 1, wherein an amount of said at least one kind of an epoxy resin having a biphenyl structure is 100% by weight of a total weight of said epoxy resin in the resin composition.

* * * * *